United States Patent
Hirose et al.

(10) Patent No.: US 9,496,492 B2
(45) Date of Patent: Nov. 15, 2016

(54) RESISTANCE SWITCHING DEVICE AND PROCESS FOR PRODUCING THEREOF

(71) Applicants: MURATA MANUFACTURING CO., LTD., Nagaokakyo-shi, Kyoto-Fu (JP); National Institute for Materials Science, Tsukuba-shi, Ibaraki-ken (JP)

(72) Inventors: Sakyo Hirose, Nagaokakyo (JP); Naoki Ohashi, Tsukuba (JP); Hideki Yoshikawa, Tsukuba (JP)

(73) Assignees: MURATA MANUFACTURING CO., LTD., Nagaokakyo-Shi, Kyoto-Fu (JP); NATIONAL INSTITUTE FOR MATERIALS SCIENCE, Tsukuba-Shi, Ibaraki (JP)

( * ) Notice: Subject to any disclaimer, the term of this patent is extended or adjusted under 35 U.S.C. 154(b) by 0 days.

(21) Appl. No.: 14/458,808

(22) Filed: Aug. 13, 2014

(65) Prior Publication Data

US 2015/0028282 A1 Jan. 29, 2015

Related U.S. Application Data

(63) Continuation of application No. PCT/JP2013/053457, filed on Feb. 14, 2013.

(30) Foreign Application Priority Data

Feb. 21, 2012 (JP) ................................ 2012-034589
Jun. 16, 2012 (JP) ................................ 2012-136453

(51) Int. Cl.
*H01L 47/00* (2006.01)
*H01L 45/00* (2006.01)
(Continued)

(52) U.S. Cl.
CPC ............... *H01L 45/08* (2013.01); *H01L 29/24* (2013.01); *H01L 29/47* (2013.01);
(Continued)

(58) Field of Classification Search
CPC ............................... H01L 29/24; H01L 29/47

USPC ............................................................ 257/4
See application file for complete search history.

(56) References Cited

U.S. PATENT DOCUMENTS 4,135,998 A * 1/1979 Gniewek ........... H01L 21/32131
204/192.15
6,479,856 B1 11/2002 Kashihara
(Continued)

FOREIGN PATENT DOCUMENTS

JP 2000-340769 A 12/2000
JP 201010582 A * 1/2010 ............. H01L 27/10
(Continued)

OTHER PUBLICATIONS

Pan et al, "Nonvolatile resistive switching memories-characteristics, mechanisms and challenges", Progress in Natural Science: Materials International 20(2010) 01-15.*
(Continued)

*Primary Examiner* — Jarrett Stark
*Assistant Examiner* — Charles N Ausar-El
(74) *Attorney, Agent, or Firm* — Arent Fox LLP

(57) ABSTRACT

A resistance switching device having a high resistance variation ratio, an excellent response characteristic, an excellent resistance memory characteristic (retention characteristics) and an excellent repeat resistance. The resistance switching device comprises an n-type oxide semiconductor and first and second electrodes which are disposed so as to interpose at least a part of the n-type oxide semiconductor therebetween wherein a Schottky junction which provides resistance variation/memory characteristics by the application of voltage having different polarities between the first and second electrodes is formed at an interface between the n-type oxide semiconductor and the first electrode; and the first electrode is positioned such that it is in contact with the n-type oxide semiconductor, and has a lower layer which is formed from Au oxide or a Pt oxide or Au or Pt containing oxygen having the thickness of 1-50 nm.

24 Claims, 23 Drawing Sheets

(51) Int. Cl.
  *H01L 29/47* (2006.01)
  *H01L 29/872* (2006.01)
  *H01L 29/861* (2006.01)
  *H01L 29/24* (2006.01)

(52) U.S. Cl.
  CPC ........ *H01L 29/8615* (2013.01); *H01L 29/872* (2013.01); *H01L 45/1253* (2013.01); *H01L 45/1266* (2013.01); *H01L 45/146* (2013.01); *H01L 45/147* (2013.01); *H01L 45/1608* (2013.01); *H01L 45/1625* (2013.01)

(56) References Cited

U.S. PATENT DOCUMENTS

| | | | | |
|---|---|---|---|---|
| 7,649,768 | B2 * | 1/2010 | Hirose | H01L 45/1608 365/158 |
| 8,009,454 | B2 * | 8/2011 | Lee | G11C 11/5685 257/4 |
| 8,241,944 | B2 * | 8/2012 | Greeley | H01L 27/2463 257/4 |
| 8,551,809 | B2 * | 10/2013 | Kumar | H01L 45/08 257/4 |
| 8,766,233 | B2 * | 7/2014 | Sakotsubo | H01L 21/02183 257/4 |
| 8,895,949 | B2 * | 11/2014 | Tendulkar | H01L 45/1608 257/2 |
| 9,035,273 | B2 * | 5/2015 | Hirose | H01L 27/101 257/310 |
| 2006/0175598 | A1 * | 8/2006 | Krieger | G11C 13/0009 257/4 |
| 2007/0205456 | A1 * | 9/2007 | Lee | G11C 11/5685 257/314 |
| 2008/0176355 | A1 * | 7/2008 | Zuppero | H01L 29/66 438/48 |
| 2009/0109730 | A1 * | 4/2009 | Hirose | H01L 45/1608 365/148 |
| 2010/0001254 | A1 * | 1/2010 | Hirose | H01C 7/10 257/4 |
| 2010/0283054 | A1 | 11/2010 | Hirano et al. | |
| 2011/0044089 | A1 * | 2/2011 | Goux | G11C 11/5614 365/148 |
| 2011/0049464 | A1 * | 3/2011 | Lee | H01L 45/04 257/4 |
| 2012/0092919 | A1 * | 4/2012 | Hirose | H01L 45/147 365/148 |
| 2012/0092920 | A1 * | 4/2012 | Hirose | G11C 11/5685 365/148 |
| 2012/0132883 | A1 * | 5/2012 | Hirose | H01L 27/101 257/4 |
| 2012/0248396 | A1 * | 10/2012 | Ramaswamy | H01L 45/08 257/4 |

FOREIGN PATENT DOCUMENTS

| | | | | |
|---|---|---|---|---|
| JP | 2011-101030 A | | 5/2011 | |
| WO | WO-2010/147073 A1 | | 12/2010 | |
| WO | WO2011043448 | * | 4/2011 | ............ H01L 47/00 |

OTHER PUBLICATIONS

Shi et al, "Properties of gold oxides $Au_2O_3$ and $Au_2O$: First-principles investigation", Physical Review B 75, 205125 (2007), The American Physical Society.*

Written Opinion and International Search Report issued in PCT/JP2013/053457, mailed on Apr. 23, 2013.

Excellent Resistance Switching Characteristics of Pt/Single-crystal Nb-Doped $SrTiO_3$, Schottky Junction; Hyunjun Sim, Dong-jun Seong, Man chang and Hyunsang Hwang; Department of Materials Science and Engineering, Gwangju Institute of Science and Technology, #1, Oryong-dong, Buk-ku, Gwangju 500-712, Korea. I-4244-0026-0/06/$20.00@2006 IEEE.

* cited by examiner

<Sample 1>

<Sample 4>

<Sample 1>

<Sample 5>

<$RuO_x$/Nb:$SrTiO_3$>

<Ru/RuO$_x$/Nb:SrTiO$_3$>

(A)

(B)

<Sample 33>

<Sample 43>

<Sample 36>

<Sample 45>

RESISTANCE SWITCHING DEVICE AND PROCESS FOR PRODUCING THEREOF

CROSS REFERENCE TO RELATED APPLICATIONS

The present application is a continuation of PCT/JP2013/053457 filed Feb. 14, 2013, which claims priority to Japanese Patent Application No. 2012-034589, filed Feb. 21, 2012, and Japanese Patent Application No. 2012-136453, filed Jun. 16, 2012, the entire contents of each of which are incorporated herein by reference.

FIELD OF THE INVENTION

The present invention relates to a resistance switching device which exhibits resistance variation/memory characteristics by the application of voltage having different polarities and a process for producing thereof, in particular the resistance switching device using an n-type oxide semiconductor and the process for producing thereof.

BACKGROUND OF THE INVENTION

As a related technology to the present invention, Non-Patent Reference discloses that a resistance variation phenomenon is expressed in a Schottky junction between a platinum (Pt) electrode and Nb-adding strontium titanate (Nb:SrTiO$_3$).

However, this technology has a problem to be solved as follows.

As a device having the Pt/Nb:SrTiO$_3$ structure, a device which has a Schottky junction between a material having a high work function such as a Pt electrode and an n-type oxide semiconductor can indeed provide the resistance variation phenomenon. However, there is a problem that since it is needed to apply a long pulse voltage or a sweep voltage to switch the resistance, response characteristics are low and a fast switching with short pulses which is required for a memory component is impossible.

Also, there is a problem that retention characteristics (resistance memory characteristics) are extremely decreased at a high temperature (for example, 100° C.)

Therefore, a problem is encountered that use is limited and it is difficult to use it as an expected next-generation non-volatile memory.

Non-Patent Reference 1: H. Sim and five others, "Excellent Resistance Switching Characteristics of Pt/Single-crystal Nb-Doped SrTiO$_3$ Schottky Junction", Non-Volatile Semiconductor Memory Workshop, 2006, IEEE NVSMW 2006. 21, Feb., 2006, p. 88-89.

SUMMARY OF THE INVENTION

Therefore, an object of the present invention is to provide a resistance switching device which can solve the above-mentioned technical problems.

Another object of the present invention is to provide a preferable process for producing the above-mentioned resistance switching device.

The present invention is directed to a resistance switching device which comprises an n-type oxide semiconductor and a first electrode and a second electrode which are disposed so as to interpose at least a part of the n-type oxide semiconductor therebetween wherein at least the first electrode is in contact with the n-type oxide semiconductor and a Schottky junction which provides resistance variation/memory characteristics by the application of voltage having different polarities between the first and second electrodes is formed at an interface between the n-type oxide semiconductor and the first electrode, and in order to solve the above-mentioned problem, the resistance switching device is characterized in that the first electrode is positioned such that it is in contact with the n-type oxide semiconductor, and has an oxygen-containing layer which is formed from a gold (Au) oxide or a platinum (Pt) oxide or gold or platinum containing oxygen.

In this invention, preferably, the first electrode has the oxygen-containing layer as a lower layer and further has an upper layer comprising Au or Pt which is formed on the lower layer. In this case, a thickness of the lower layer is preferably 1 nm or more and 50 nm or less.

In the resistance switching device of the present invention, the n-type oxide semiconductor preferably comprises titanium oxide (TiO$_2$), strontium titanate (SrTiO$_3$) or barium titanate (BaTiO$_3$) or a solid solution thereof.

The invention is directed to a process for producing a resistance switching device which comprises a n-type oxide semiconductor and a first electrode and a second electrode which are disposed so as to interpose at least a part of the n-type oxide semiconductor therebetween wherein at least the first electrode is in contact with the n-type oxide semiconductor and a Schottky junction which provides resistance variation/memory characteristics by the application of voltage having different polarities between the first and second electrodes is formed at an interface between the n-type oxide semiconductor and the first electrode.

The process for producing the resistance switching device is characterized by comprising a step of providing the n-type oxide semiconductor and a step of forming the first and second electrodes which are disposed so as to interpose at least a part of the n-type oxide semiconductor therebetween; and the step of forming the first electrode comprises a step of forming a layer of platinum or gold under an atmosphere in which an oxygen partial pressure is 0.01-0.22 Pa.

According to the resistance switching device of the present invention, a resistance variation ratio and response characteristics are improved. Furthermore, resistance memory characteristics (retention characteristics) and a repeat resistance can be improved.

With respect to a principle of action of the resistance switching device of the present invention, though there are some unclear point, the inventors of the present invention presumed that a resistance variation phenomenon which was generated by the application of voltage having different polarities in a Schottky junction device is caused by the exchange of oxygen between the electrode and the n-type oxide semiconductor.

Since a high amount of energy is needed to remove oxygen from an oxide, a conventional device having the Pt/Nb:SrTiO$_3$ structure has a low response characteristics and needs a very long voltage pulse. However, the inventors assume that the problem of the conventional technology will be able to be solved if an oxygen-containing layer (i.e. a layer which is formed from an oxide of Au or Pt or Au or Pt containing oxygen) which has a relatively easy movable oxygen can be formed on an interface.

When reaching the above-mentioned configuration based on the above-mentioned consideration, a resistance switching device is achieved wherein the resistance variation ratio and the response characteristics are improved, and the resistance memory characteristics and the repeat resistance are also improved.

The reason for this is assumed as followings. Due to a property of an oxide of Au or Pt or Au or Pt containing oxygen that ejects oxygen at a relatively low temperature, the easy movable oxygen becomes to be exchanged between the first electrode and the n-type oxide semiconductor even by the application of a relatively short voltage pulse. Thus, an electrical conduction property through a local leak path of a depletion layer which is spread in the semiconductor side is changed, and switching from a high resistance state to a low resistance state takes place with a high response. Also, since there are sufficient oxygen at the interface, oxygen is stabilized which is extracted from/to the n-type oxide semiconductor side, thereby improving the resistance memory characteristics.

In particular, the response rate can be much increased and the resistance memory characteristics can be much improved by the application of the structure having the oxygen-containing layer as the lower layer and the upper layer comprising Au or Pt which is formed on the lower layer and the regulation of the lower layer to 1-50 nm.

BRIEF DESCRIPTION OF THE DRAWINGS

FIG. 12(A) is a graph contrastively showing the results of the state analysis of Sample 1 as a conventional example and Sample 4 within the scope of the present invention, and FIG. 12(B) is a graph showing a result of peak separation of a Pt and PtO components for Sample 4.

DETAILED DESCRIPTION OF THE EXEMPLARY EMBODIMENTS

Figure 1A:
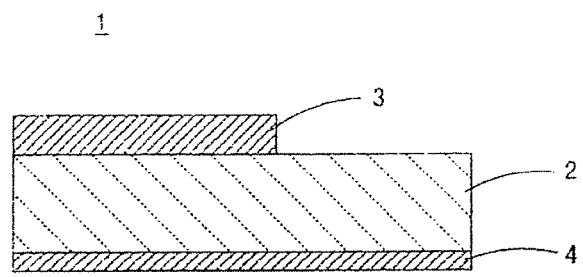
FIG. 1A is a schematically cross-sectional view of a resistance switching device 1 according to a first embodiment of the present invention.

The resistance switching device 1 according to the first embodiment of the present invention will be described with reference to FIG. 1A.

The resistance switching device 1 comprises an n-type oxide semiconductor 2 and first and second electrodes 3 and 4 which are disposed in a state of interposing at least a part of the n-type oxide semiconductor 2 therebetween and being in contact with the n-type oxide semiconductor 2. In this embodiment, the first electrode 3 and the second electrode 4 are disposed such that they face each other via at least a part of the n-type oxide semiconductor 2.

In this resistance switching device 1, a Schottky junction is formed at an interface between the n-type oxide semiconductor 2 and the first electrode 3 wherein the Schottky junction provides resistance variation/memory characteristics by the application of voltage having different polarities between the first and second electrodes 3 and 4.

This embodiment is characterized in that the first electrode 3 has an oxygen-containing layer which is formed from an oxide of Au or Pt or Au or Pt containing oxygen.

For example, as the oxide of Pt, at least PtO, $Pt_2O_3$ and $PtO_2$ are known. However, it is not clear whether there is an intermediate state between PtO and $Pt_2O_3$ or between $Pt_2O_3$ and $PtO_2$. With respect to Pt, a reason for defining the above-mentioned first electrode 3 as "having an oxygen-containing layer which is formed from an oxide of Pt or Pt containing oxygen" is as follows. For example, when a composition analysis of an entire layer constructing the first electrode 3 is performed, a result of $PtO_{0.8}$ is obtained. However, it is unclear if this result shows an oxide in the intermediate state between Pt and PtO or a mere mixture of Pt and PtO. The same is applied to Au. Therefore, the above expression is used in order to comprise both states in the scope of the present invention.

As seen from the above description, "$PtO_{0.8}$" means that oxygen is contained at the ratio of Pt:O=1:0.8. Therefore, hereinafter, expressions such as "$PtO_x$" as used herein should be understood to mean that oxygen is contained at the ratio of Pt:O=1:x.

Oxygen present in the first electrode 3 may be not necessarily uniformly distributed. FIG. 1B schematically shows some typical examples (1)-(9) of the oxygen distribution state in the first electrode 3. FIG. 1B shows the n-type oxide semiconductor 2 and the first electrode 3 which are shown in FIG. 1A. In FIG. 1B, the oxygen distribution state in the first electrode 3 is shown by shading, and as shown in a scale at the lower left of FIG. 1B, the darker the shading is, the larger the amount of oxygen is.

As seen from the oxygen distribution states shown in FIG. 1B, the oxygen may not be uniform in the direction of the thickness of the electrode 3 and may not be uniform in the direction the plane of the electrode 3, furthermore there may be a region where there is no oxygen in the electrode 3. A reason for allowing the oxygen distribution to be non-uniform in the electrode 3 is that the resistance switching in the resistance switching device 1 is locally arisen at a part of the electrode 3 but not at the entire the electrode 3. It is noted that it may be considered that there is a possibility that the non-uniformity of the oxygen distribution in the electrode 3 contributes to an improvement of the characteristics rather than the uniformity.

On the other hand, the second electrode 4 is formed from a material such as In which forms an ohmic junction with the n-type oxide semiconductor 2. Since even when a metal such as Pt which essentially forms the Schottky barrier is used, a contact relatively comparable to ohmic can be provided depending on a process condition, such metal can be used as the material of the second electrode 4.

The n-type oxide semiconductor 2 may be formed from any materials as long as the materials can form the Schottky barrier at the interface with the first electrode 3, but is formed from, for example, titanium oxide ($TiO_2$), strontium titanate ($SrTiO_3$) or barium titanate ($BaTiO_3$) or a solid solution thereof. An additive which actions as a donor may be added to it to convert the material into a semiconductor, or the material may be converted into a semiconductor by the generation of an oxygen defect with a reduction treatment, etc. As an example, an Nb-adding $SrTiO_3$ single crystal substrate is used as the n-type oxide semiconductor 2.

According to the resistance switching device 1, as seen from Experimental Examples described below, the resistance variation ratio and the response characteristics are improved, and further the resistance memory characteristics and the repeat resistance may be improved.

In producing of the above resistance switching device 1, a step of providing the n-type oxide semiconductor 2 and a step of forming the first and second electrodes 3 and 4 which are disposed so as to interpose at least a part of the n-type oxide semiconductor 2 therebetween are performed. In order to form the first electrode 3, a step of forming a layer by a DC sputtering using an Au target or a Pt target is performed. As seen from Experimental Examples described below, an atmosphere is preferably applied in which an oxygen partial pressure is 0.01-0.22 Pa in this step of forming the layer. It is noted that an RF sputtering, a vapor deposition, or a molecular beam epitaxy can be used in place of the DC sputtering.

Next, a resistance switching device 1a according to the second embodiment of the present invention will be described with reference to FIG. 2. In FIG. 2, elements corresponding to the elements shown in FIG. 1A are denoted by the same reference numerals, and the overlapped explanations are omitted.

The resistance switching device 1a shown in FIG. 2 is characterized in that the first electrode 3 comprises a lower layer 5 which is positioned so as to be in contact with the n-type oxide semiconductor 2 and an upper layer 6 which is formed on the lower layer wherein the lower layer 5 is formed from the oxide of Au or Pt or Au or Pt containing oxygen and the upper layer 6 is formed form Au or Pt. In this case, the thickness of the lower layer 5 is preferably 1 nm or more and 50 nm or less. In also this embodiment, the lower layer 5 has the oxygen distribution as shown in FIG. 1B described above.

According to the resistance switching device 1a, the response rate is much increased and the resistance memory characteristics can be much improved.

Figure 3:
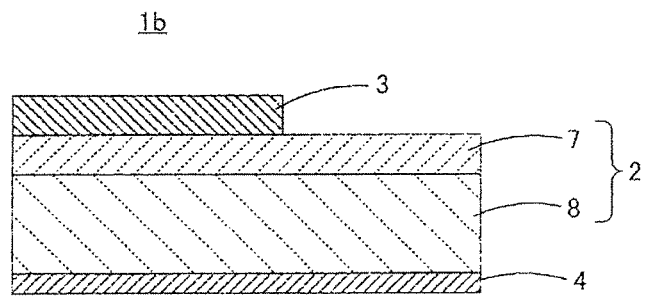
FIG. 3 is a schematically cross-sectional view of a resistance switching device 1b according to a third embodiment of the present invention.

Next, a resistance switching device 1b according to the third embodiment of the present invention will be described with reference to FIG. 3. In FIG. 3, elements corresponding to the elements shown in FIG. 1A are denoted by the same reference numerals, and the overlapped explanations are omitted.

In the resistance switching device 1b shown in FIG. 3, as the n-type oxide semiconductor 2, a semiconductor is used in which a n-type oxide semiconductor thin layer 7 such as a $BaTiO_3$ thin layer is formed on a n-type oxide semiconductor substrate 8 such as the Nb adding $SrTiO_3$ singly crystal substrate. A nearly ohmic junction is formed between the n-type oxide semiconductor and the Nb adding $SrTiO_3$ single crystal substrate. The first electrode 3 is formed so as to be in contact with the n-type oxide semiconductor thin layer 7, and the second electrode 4 is formed so as to be in contact with the n-type oxide semiconductor substrate 8.

Figure 4:
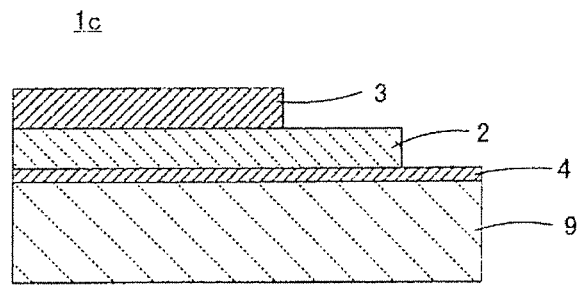
FIG. 4 is a schematically cross-sectional view of a resistance switching device 1c according to a fourth embodiment of the present invention.

Next, a resistance switching device 1c according to the fourth embodiment of the present invention will be described with reference to FIG. 4. In FIG. 4, elements corresponding to the elements shown in FIG. 1A are denoted by the same reference numerals, and the overlapped explanations are omitted.

Figure 1B:
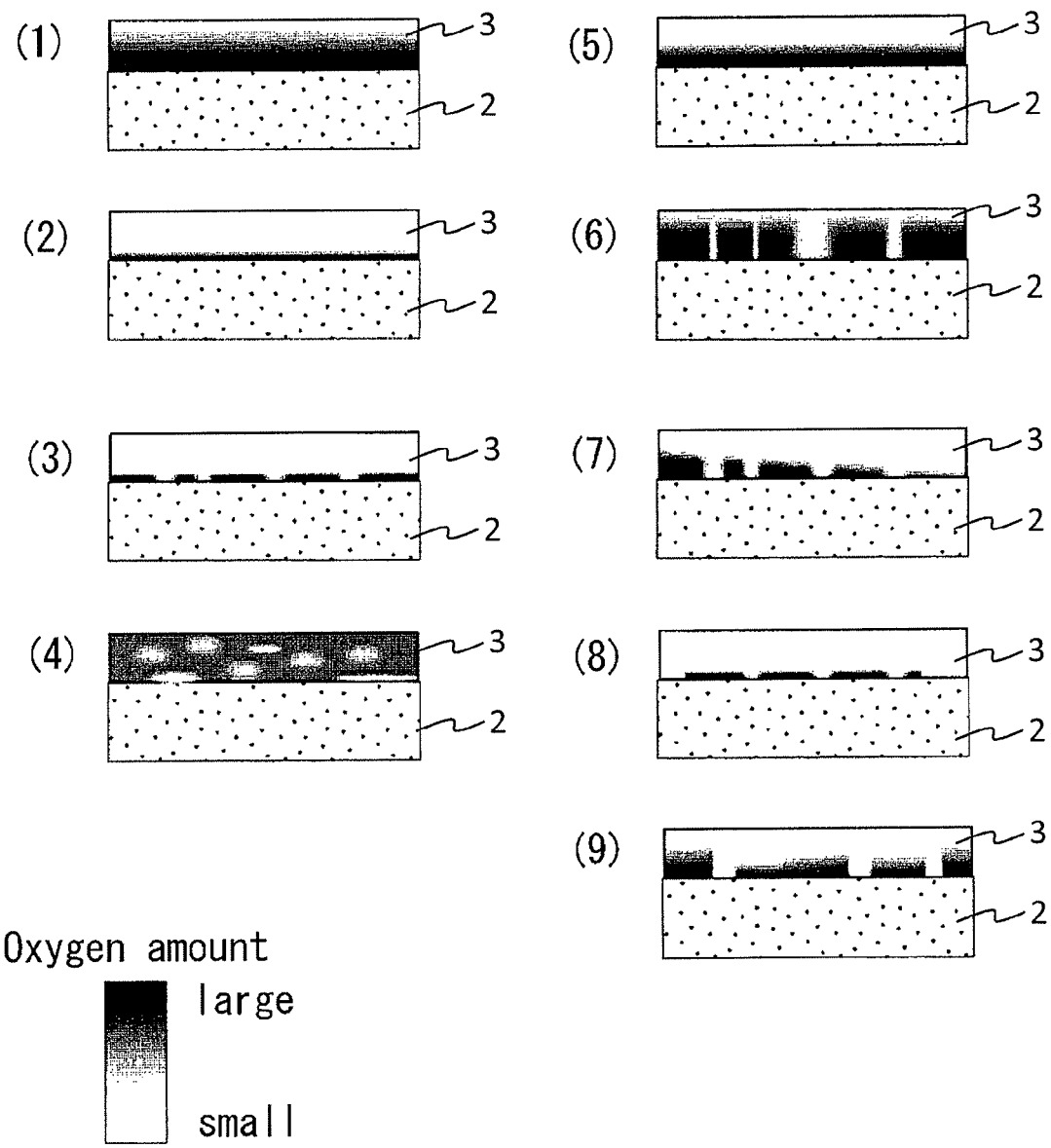
FIG. 1B is a schematically cross-sectional view of an n-type oxide semiconductor 2 and a first electrode 3 shown in FIG. 1A and schematically shows some typical examples (1)-(9) of an oxygen distribution state in the first electrode 3.
Figure 2:
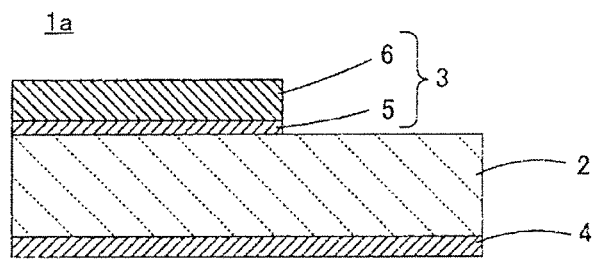
FIG. 2 is a schematically cross-sectional view of a resistance switching device 1a according to a second embodiment of the present invention.

The resistance switching device 1c shown in FIG. 4 has briefly a structure in which the entire resistance switching device 1 shown in FIG. 1A is formed on, for example, a supporting substrate 9 comprising a Si substrate. The supporting substrate 9 functions for providing the resistance switching device 1c with a sufficient mechanical strength.

Therefore, the n-type oxide semiconductor 2 can be constructed by the thin layer. Also, the second electrode 4 is formed so as to extend from the interface between the n-type oxide semiconductor 2 and the supporting substrate 9 to the exposed surface of the supporting substrate 9.

Figure 5:
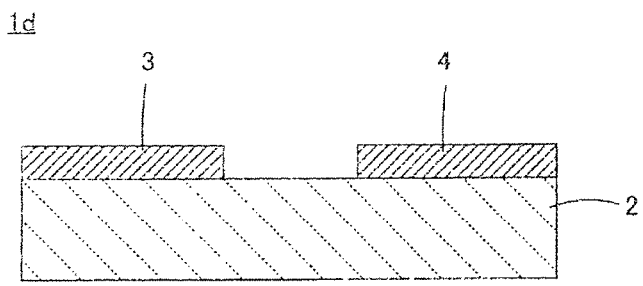
FIG. 5 is a schematically cross-sectional view of a resistance switching device 1d according to a fifth embodiment of the present invention.

Next, a resistance switching device 1d according to the fifth embodiment of the present invention will be described with reference to FIG. 5. In FIG. 5, elements corresponding to the elements shown in FIG. 1A are denoted by the same reference numerals, and the overlapped explanations are omitted.

The resistance switching device 1d shown in FIG. 5 is characterized in that the first and second electrodes 2 and 3 are alongside formed on one main surface of the n-type oxide semiconductor 2. A part of the n-type oxide semiconductor 2 is interposed between the first and second electrodes 2 and 3.

The present invention will be described in more detail below based on Experimental Examples.

EXPERIMENTAL EXAMPLE 1

In Experimental Example 1, the resistance switching device 1 having the structure shown in FIG. 1A was produced.

The Nb (0.5 wt %) adding $SrTiO_3$ (100) single crystal substrate manufactured by Furuuchi Chemical Corporation (hereinafter, "$Nb:SrTiO_3$ single crystal substrate") was used as the n-type oxide semiconductor 2 shown in FIG. 1A.

The above $Nb:SrTiO_3$ single crystal substrate was placed on an substrate holder of a DC sputtering apparatus, and vacuuming was performed. After vacuum of $1.33 \times 10^{-4}$ Pa was reached, a flow rate of an argon (Ar) gas was fixed to be 10 sccm and a flow rate of an oxygen ($O_2$) gas was changed in the range of 0-10 sccm to regulate an atmosphere gas to that as shown in the "$Ar/O_2$ ratio" column of the following table. Then, a valve was regulated to control the vacuum to be 0.67 Pa or 0.25 Pa.

On the other hand, platinum (Pt) was used as an electrode material of the electrode 3 for forming a Schottky junction in shown FIG. 1A. In particular, two inches of a Pt target was placed in the DC sputtering apparatus; 100 W of DC power was applied to the target to generate a plasma; and a shutter which was placed in front of a cathode was opened to form the first electrode 3 shown in FIG. 1A having the oxygen-containing layer which was formed from an oxide of Pt or Pt containing oxygen. Then, the patterning using a metal mask was performed such as a diameter of the first electrode was 200 μm. A thickness of the first electrode was about 200 nm.

The second electrode 4 shown in FIG. 1A which formed an ohmic contact with the $Nb:SrTiO_3$ single crystal substrate was formed by the application of In metal on n-type oxide semiconductor 2 by ultrasonic soldering. It is noted that it had been confirmed that the In electrode forms the ohmic contact with the $Nb:SrTiO_3$.

Each of the obtained samples was evaluated with a semiconductor parameter measuring instrument ("B1500A" manufactured by Agilent Technologies, Inc.), a current-voltage generator ("R6246" manufactured by Advantest Corporation) and a manual probe system.

In Experimental Example 1, a resistance variation ratio was calculated based on current-voltage (I-V) characteristics, and pulse voltage response characteristics were evaluated by using a pulse source meter.

In particular, in order to obtain the current-voltage characteristics, tungsten probe needles were placed in contact with the first and second electrodes, and the first electrode was used as a ground and the voltage of the second electrode was swept at the rate of 1 V/sec to obtain the current-voltage characteristics. Here, the voltage was swept in the following order:

E1⇒ 0 V⇒ E2⇒ 0 V⇒ E1
(for example, −5 V⇒ 0 V⇒ 5 V⇒ 0 V⇒ −5 V),
and the current during sweeping was measured.

Figure 6:
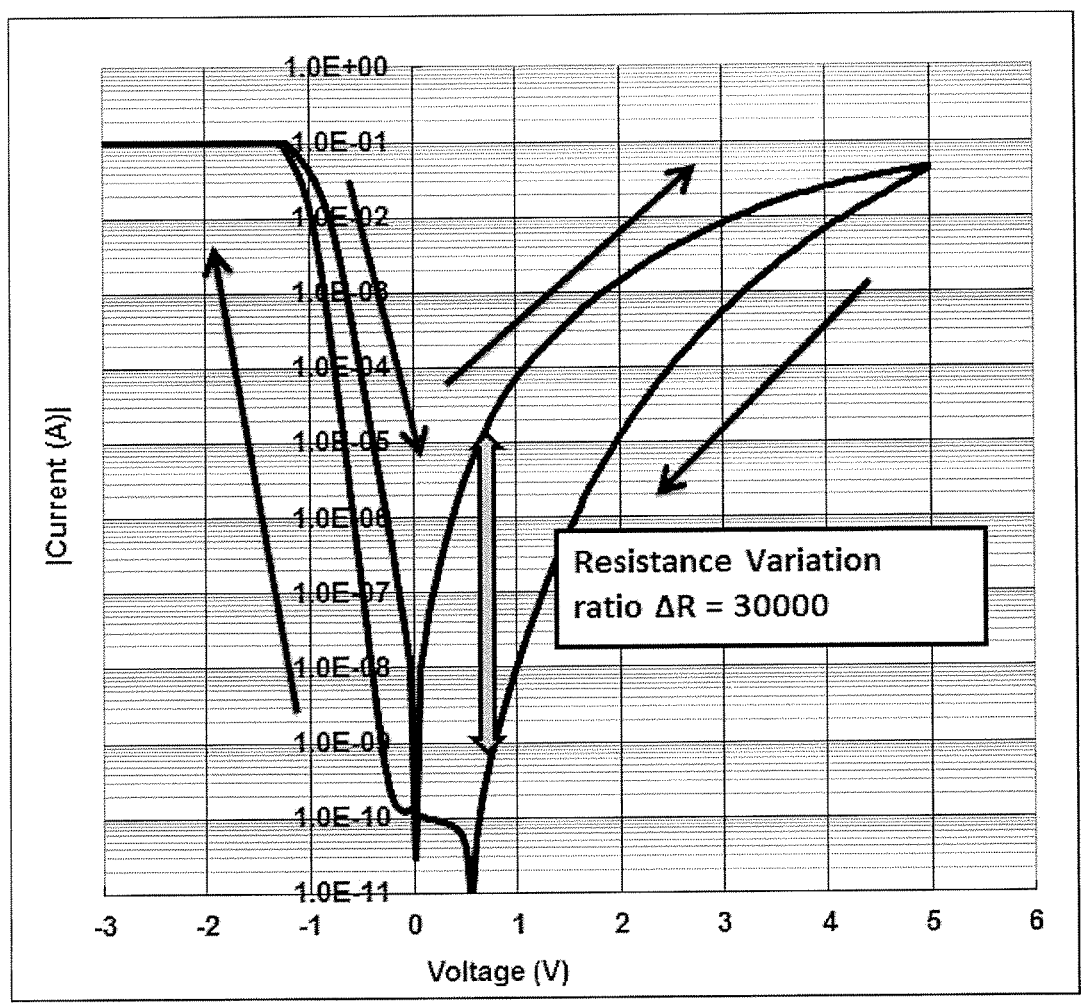
FIG. 6 is a graph showing a current-voltage characteristics of Sample 1 produced in Experimental Example 1 as a conventional example.

Sample 1 shown in Table 1 has the first electrode comprising Pt and corresponds to the prior art. The current-voltage characteristics for Sample 1 are shown in FIG. 6. As shown in FIG. 6, in the current-voltage characteristics, a hysteresis arises between the voltage sweeping to and from, as shown by arrows, the resistance switching arises from a low resistance state to a high resistance state at a positive electrode side and from a high resistance state to a low resistance state at a negative electrode side. Based on the current value at the voltage at which the maximum resistance variation was provided, the resistance variation ratio ΔR was calculated from the following formula:

$$\Delta R = I_{LRS}/I_{HRS}$$

(wherein, $I_{LRS}$ is a current value at a given voltage in a low resistance state, and $I_{HRS}$ is a current value at the given voltage in a high resistance state.)

Next, a method for testing the pulse voltage response characteristics is described. A voltage pulse of +7 V having a pulse width of 100 μsec was applied once as a Hset voltage for switching to the high resistance state by using a pulse source meter, and the current was measured at +0.5 V of voltage. Then, a voltage pulse of −5 V having a pulse width of 100 μsec was applied once as a Lset voltage for switching to the low resistance state, and the current was measured at +0.5 V of voltage again. Then, the Hset voltage and Lset voltage were fixed, and the pulse width was lengthened to 1 msec, 10 msec and 100 msec, and the current after the application of the voltage was measured at +0.5 V of voltage. The resistance variation ratio (ΔR) was calculated from the current value after the application of the Hset voltage and the current value after the application of the Lset voltage, and the minimum pulse width having the resistance variation ratio of 10 or more was defined as a response rate.

In Table 1, the resistance variation ratio ΔR was shown in the column "ΔR" and the response rate was shown in the column "Response Characteristics".

TABLE 1

| | Formation Condition and State of the Electrode | | | | Resistance Variation Characteristics | |
|---|---|---|---|---|---|---|
| | | | Oxygen | | | |
| Sample No. | $Ar/O_2$ ratio | Total pressure (Pa) | Partial Pressure (Pa) | State Analysis | ΔR | Response Characteristics |
| 1 | 10/0 | 0.67 | — | Pt | 30000 | 100 msec |
| 2 | 10/0.5 | 0.67 | 0.03 | partial oxidation/ PtO—Pt mixture | 152000 | 100 μsec |
| 3 | 10/1 | 0.67 | 0.06 | partial oxidation/ PtO—Pt mixture | 350000 | 100 μsec |
| 4 | 10/3 | 0.67 | 0.15 | partial oxidation/ PtO—Pt mixture | 172000 | 100 μsec |
| 5 | 10/5 | 0.67 | 0.22 | PtO | 70000 | 100 μsec |

TABLE 1-continued

| Sample No. | Formation Condition and State of the Electrode | | | | Resistance Variation Characteristics | |
|---|---|---|---|---|---|---|
| | Ar/O$_2$ ratio | Total pressure (Pa) | Oxygen Partial Pressure (Pa) | State Analysis | $\Delta R$ | Response Characteristics |
| 6 | 10/10 | 0.67 | 0.34 | Pt$_2$O$_3$ | 150 | 10 msec |
| 7 | 24/1 | 0.25 | 0.01 | partial oxidation/ PtO—Pt mixture | 100000 | 100 μsec |
| 8 | 22/3 | 0.25 | 0.03 | partial oxidation/ PtO—Pt mixture | 149000 | 100 μsec |
| 9 | 20/5 | 0.25 | 0.05 | partial oxidation/ PtO—Pt mixture | 120000 | 100 μsec |
| 10 | 10/15 | 0.25 | 0.15 | partial oxidation/ PtO—Pt mixture | 290000 | 100 μsec |

In Experimental Example 1, samples wherein the resistance variation ratio $\Delta R$ was 1,000 or more and the response rate was 100 μsec were judged as being accepted. Samples 2-5 and 7-10 were judged as being accepted, in which the "oxygen partial pressure" was within the range of 0.01-0.22 Pa.

As seen from Table 1, for the resistance switching device of Sample 1 which was constructed of the conventional Pt electrode and the Nb:SrTiO$_3$ semiconductor, the current-volume characteristics showing the large resistance variation ratio $\Delta R$ of 30,000 were provided as shown in FIG. 6. On the other hand, for the resistance switching devices of Samples 2-5 and 7-10 within the scope of the present invention, the current-volume characteristics showing the larger resistance variation ratio $\Delta R$ than that of Sample 1 were provided, thus it is recognized that the resistance variation characteristics were significantly improved. As a representative example, the current-volume characteristics for the resistance switching device of Sample 4 are shown FIG. 7.

Figure 7:
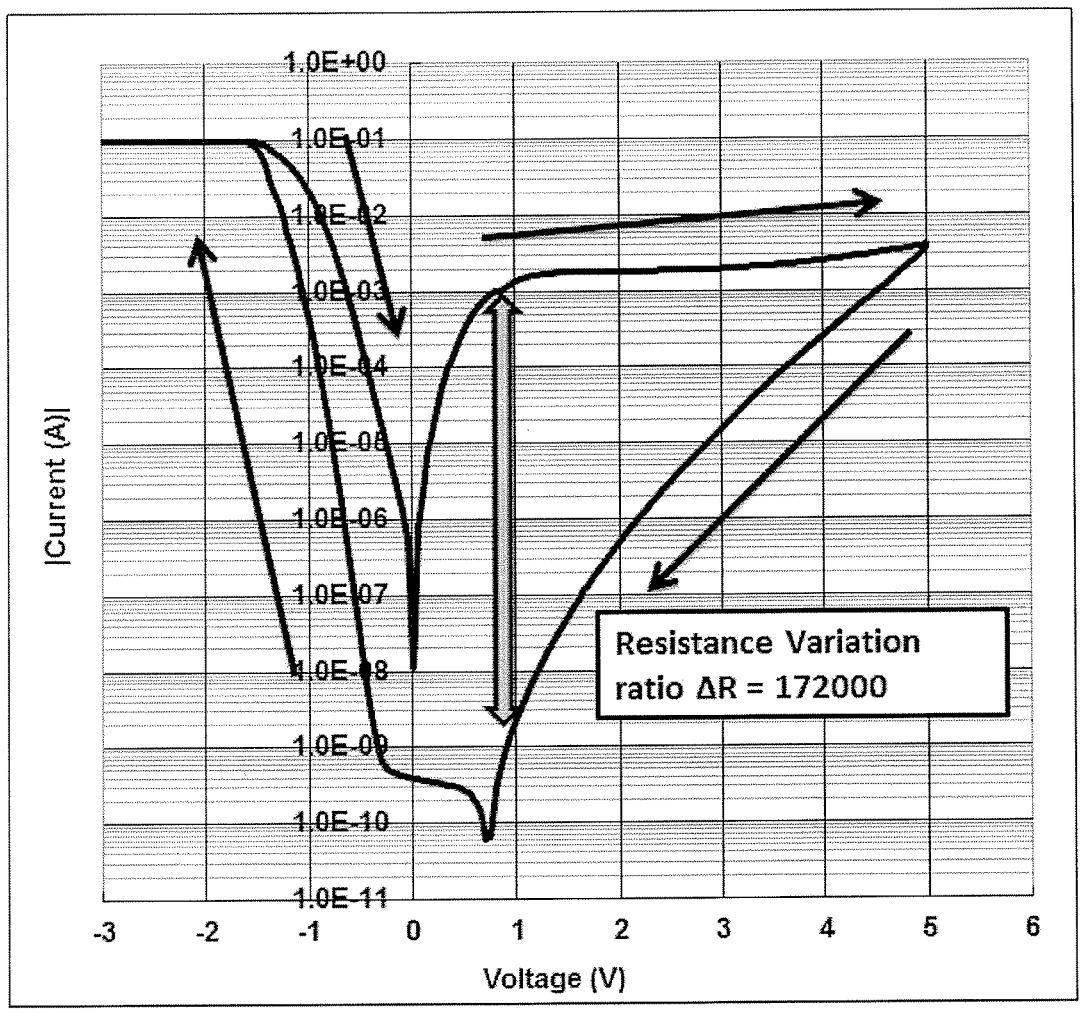
FIG. 7 is a graph showing the current-voltage characteristics of Sample 4 within the scope of the present invention produced in Experimental Example 1.

As understood from the comparison between FIG. 7 and FIG. 6, for the resistance switching device of Sample 4, the hysteresis at the positive voltage is large, i.e. is recognized to have the extremely large resistance variation characteristics.

Figure 8:
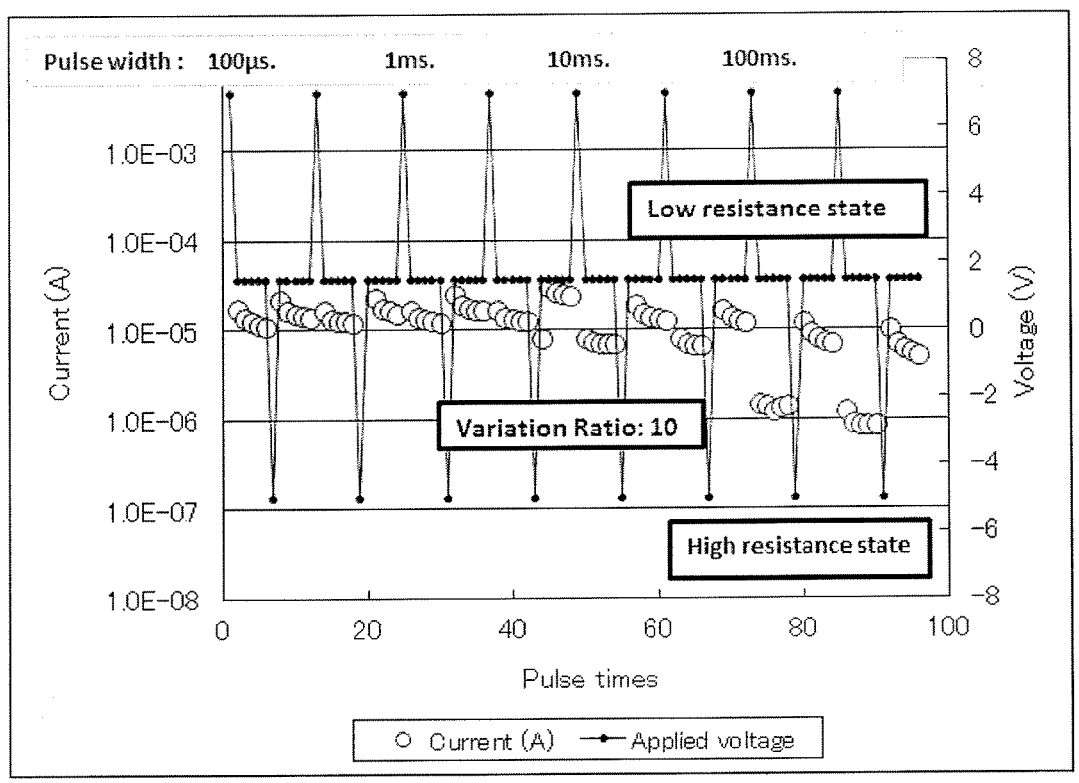
FIG. 8 is a graph showing an evaluation result of response characteristics of Sample 1 produced in Experimental Example 1 as a conventional example.

Next, attention is focused on the response characteristics. For the conventional resistance switching device of Sample 1, as shown in FIG. 8, the response characteristics did not substantially change when the pulse voltage of 100 μsec-10 msec was applied, and it changed by only one digit when the long pulse voltage of 100 msec. Therefore, even if the large resistance variation ratio $\Delta R$ in the current-voltage characteristics is obtained, the very long pulse voltage is needed to switch the resistance by the application of the pulse voltage. This becomes a serious problem in a device such as a non-volatile memory which requires a high speed action.

Figure 9:
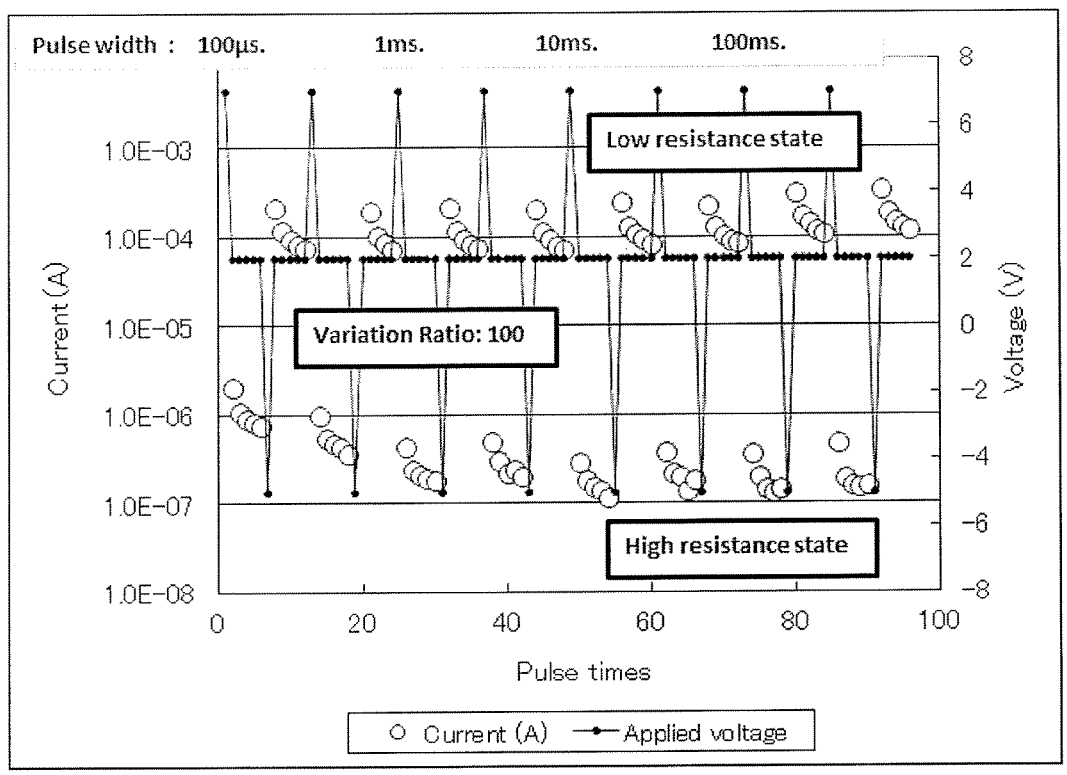
FIG. 9 is a graph showing the an evaluation result of response characteristics of Sample 4 within the scope of the present invention produced in Experimental Example 1.

In contrast, as shown in FIG. 9, for the resistance switching device of Sample 4 within the scope of the present invention, when the relatively short pulse voltage of 100 μsec was applied, a change of near double digits (the resistance variation ratio $\Delta R$=100) was obtained, and it is recognized that the response characteristics are extremely improved.

Though, due to the equipment used in this experiment, the response characteristics at the pulse of less than 100 μsec could not be evaluated, for all of the resistance switching device of Samples 2-5 and 7-10 within the scope of the present invention, when the pulse voltage of 100 μsec was applied, the resistance variation ratio $\Delta R$ of about 100 was obtained, therefore, it is assumed that it responses to the shorter pulse voltage, and provides the resistance variation ratio $\Delta R$ of 10 or more.

As shown in Table 1 for the resistance switching device of Sample 6, when the first electrode was formed under the condition that the amount of oxygen was increased to Ar/O$_2$=10/10, the hysteresis in the current-voltage characteristics became very small and the resistance variation ratio became extremely small. Thus, the result of the response characteristics was very bad. The reason is assumed as follows.

Platinum oxide of PtO$_x$ is known to increase an electrical resistivity with progressing oxidation (that is, increasing x), Pt$_2$O$_3$ wherein x is 1.5 has higher electrical resistivity than that of PtO wherein x=1.0 by double digits. Therefore, for Sample 6, it is assumed that since the resistance of the electrode was high, the Schottky barrier was not formed and the superior characteristics could not be obtained as mentioned above.

The results of the state analysis for the formed first electrode are shown in the column "State Analysis" of Table 1. They were measured by using the Rutherford backscattering spectrometry (RBS) and the photoelectron spectroscopy (XPS). In the XPS, a Pt4f spectrum was confirmed by using an Al-Kα ray, and Pt$^{2+}$ (PtO, platinum oxide state) and Pt$^{0+}$ (Pt, metal state) were confirmed. In the RBS, since measurement accuracy was low at the thickness of the electrode shown in Table 1, model samples wherein the electrode thickness was 20-40 nm were produced, and they were evaluated.

Figure 10:
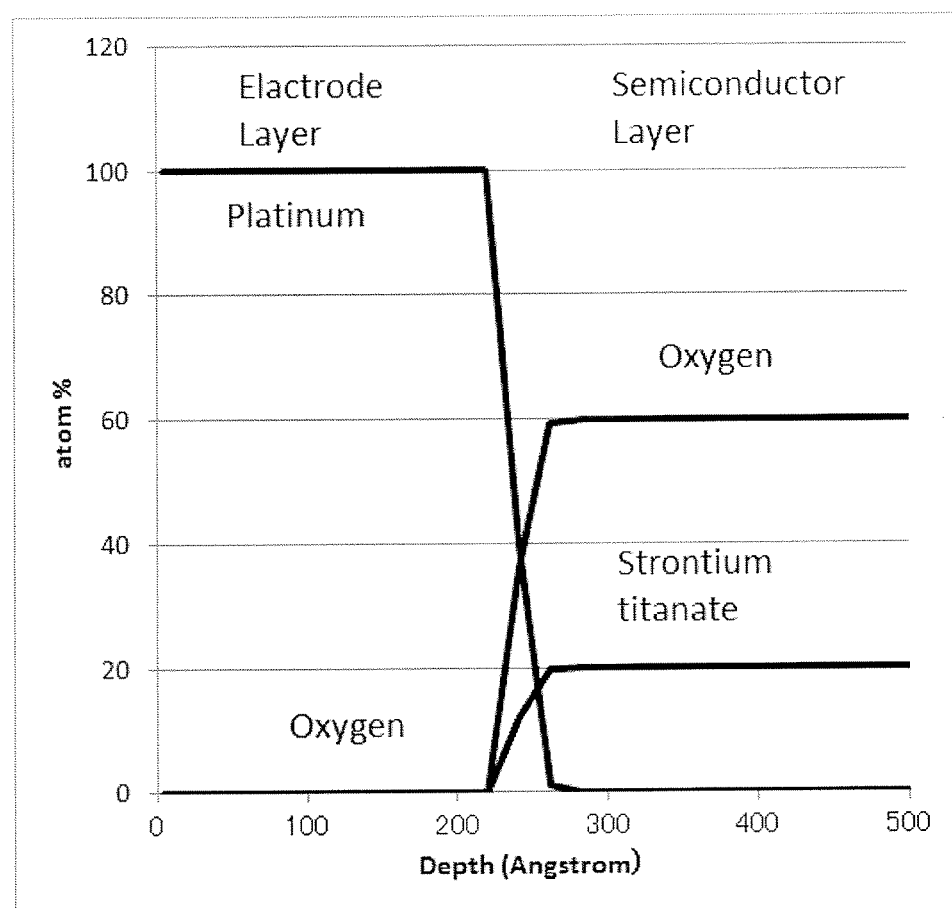
FIG. 10 is a graph showing a result of a state analysis of a first electrode of Sample 1 produced in Experimental Example 1 as a conventional example by a Rutherford backscattering spectrometry.
Figure 11:
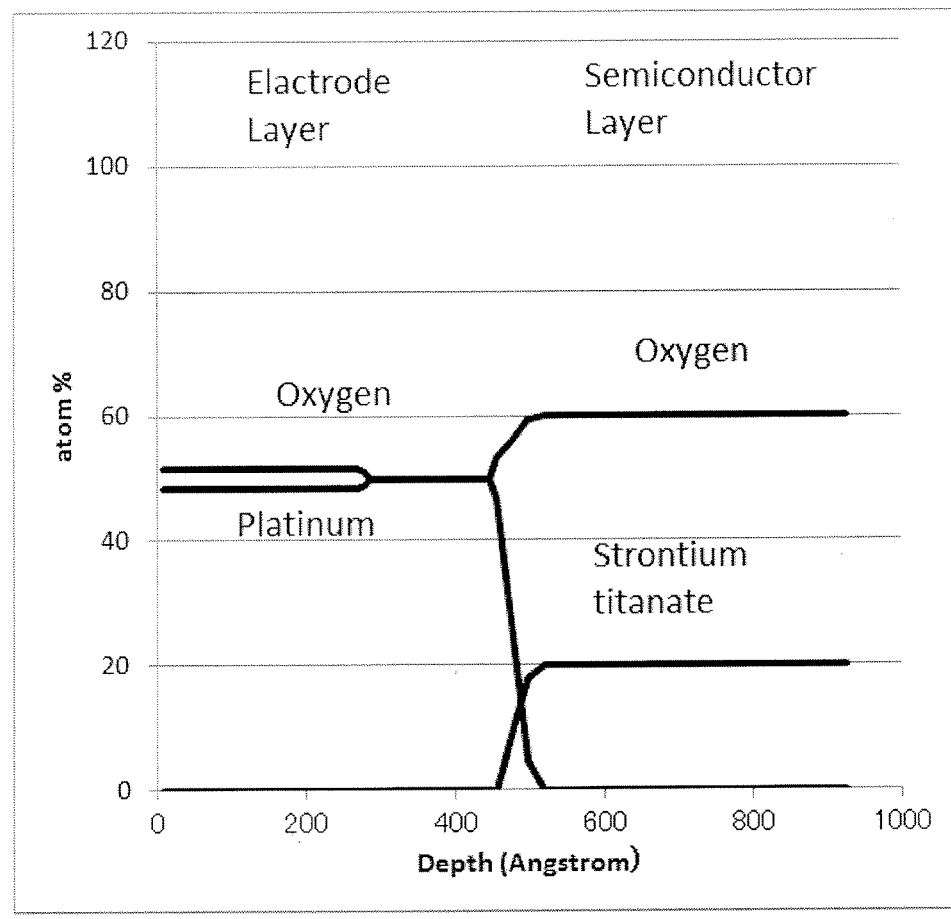
FIG. 11 is a graph showing the result of the state analysis of a first electrode of Sample 5 within the scope of the present invention produced in Experimental Example 1 by the Rutherford backscattering spectrometry.

As representative examples, the result of the RBS for Sample 1 is shown in FIG. 10 and the result of the RBS for Sample 5 is shown in FIG. 11.

From the result of the RBS, in the resistance switching device of Sample 1 as the conventional example, the first electrode is metal Pt, and also from the result of the XPS below, platinum monoxide PtO could not be confirmed. For the resistance switching device of Sample 6, in the RBS analysis, the Pt:O was confirmed to be about 2:3, the result suggested the formation of Pt$_2$O$_3$. On the other hand, for the resistance switching device of Sample 5, in the RBS analysis, Pt:O was confirmed to be 1:1, and the formation of platinum monoxide PtO was confirmed.

It is noted that the description "partial oxidation/PtO—Pt mixture" in the column "State Analysis" of Table 1 means that, though it is unclear if it is constructed of an oxide which is partial oxidized to the intermediate state between PtO and Pt, or of a mere mixture of PtO and Pt as mentioned above, at least the oxide of Pt or Pt containing oxygen is present.

Figure 12:
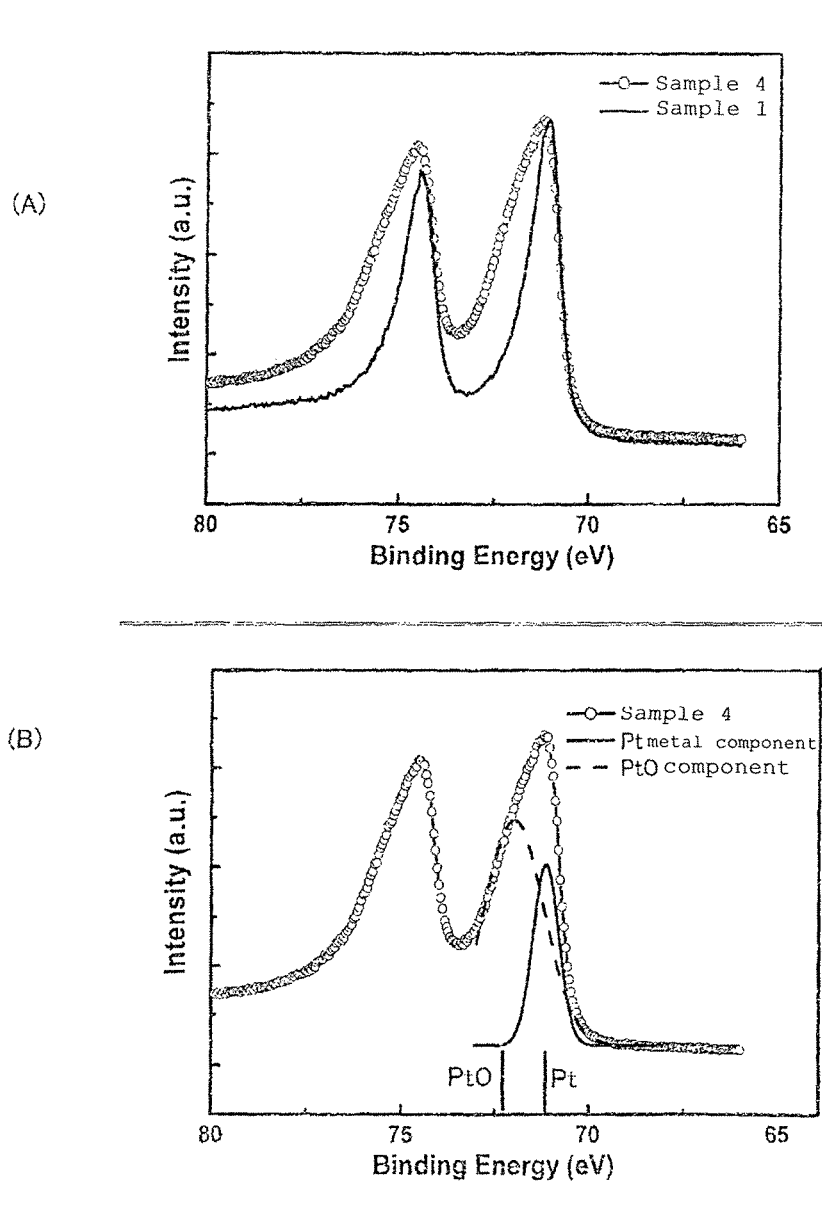
FIG. 12 is graphs showing a result of a state analysis of the first electrode of the samples produced in Experimental Example 1 by a photoelectron spectroscopy.

As representative examples, the measurement results of the XPS for Sample 1 and Sample 4 are shown in FIG. 12. As seen from FIG. 12(A), in Sample 1 of which the first electrode was demonstrated to be Pt metal by the RBS measurement, a Pt4f orbital is positioned at about 71 eV while in Sample 4 the clear shoulder is present at about 72 eV. The energy position of the shoulder corresponds to platinum monoxide PtO (Pt$^{2+}$), therefore, it is confirmed that at least Pt metal and PtO are co-present in Sample 4. FIG.

12(B) shows the result of peak separation of Pt and PtO components. It is recognized that PtO and Pt are present at a rate of about 6:4 (x=0.67) from the peak intensity ratio.

Similarly, in Samples 2 and 3, though the intensity ratio is different, the spectra of $Pt^{2+}$ and $Pt^{0+}$ are observed in the XPS spectrum, and the smaller the $Ar/O_2$ ratio upon forming the electrode becomes (that is, the larger the flowing amount of oxygen becomes), the higher the intensity of $Pt^{2+}$ becomes, and it was demonstrated that at least $PtO_x$ (x is more than 0 and not more than 1) is present (that is, Pt metal and PtO are co-present).

As described above, it is confirmed that, by the configuration that the first electrode has the oxygen-containing layer formed from the oxide of Pt or Pt containing oxygen, the resistance switching device wherein the resistance variation ratio ΔR is high and the response characteristics is superior can be achieved. Though this principle is still unclear in many ways, it is assumed as follows. By use of the oxide of Pt or Pt containing oxygen from which oxygen is relatively easily removed as a material of the first electrode, the exchange of oxygen between the n-type oxide semiconductor and the first electrode becomes easy, thereby improving the resistance variation phenomenon and quickening the response characteristics.

It is noted that as a result of the inventor's text, it has been clarified that there is a strong correlation between the resistance switching phenomenon found in the Schottky junction component and oxidation of the electrode or oxygen contained in the electrode. Therefore, based on the current-voltage characteristics evaluation in this Experimental Example, in the device having the resistance variation ratio ΔR of 30,000 or more, i.e. Samples 2-5 and 7-10, it can be deemed that the electrode is oxidized or contains oxygen in at least vicinity of the interface of the electrode with the n-type oxide semiconductor.

EXPERIMENTAL EXAMPLE 2

In Experimental Example 2, the resistance switching device 1a having the structure shown in FIG. 2 was evaluated.

Similarly to Experimental Example 1, the $Nb:SrTiO_3$ single crystal substrate is used as the n-type oxide semiconductor 2 shown in FIG. 2; the lower layer 5 having the thickness shown in the column "Layer Thickness" of Table 2 below was formed on the $Nb:SrTiO_3$ single crystal substrate at the gas flow ratio shown in the column "$Ar/O_2$ ratio" of "Lower Layer" of Table 2; and then, the upper layer 6 having the thickness shown in the column "Layer Thickness" of Table 2 was formed at the gas flow ratio shown in the column "$Ar/O_2$ ratio" of "Lower Layer" of Table 2 with regulating the vacuum degree to 0.67 Pa. The total thickness of the lower layer and the upper layer was regulated to be about 200 nm. The DC power and the vacuum degree during forming the layer were the same as those in Experimental Example 1.

It is noted that when the upper layer of Pt was formed after the formation of the lower layer, the gas flow ratio was changed, and then pre-sputtering was performed on the DC power of 100 W for 2 minutes, thereby allowing the change of the target by the formation of the lower layer to be ignorable.

In order for comparison, a sample in which only the lower layer was formed, i.e. Samples 15 and 20 were evaluated in the same way. It is noted that Samples 15 and 20 corresponds to Samples 2 and 5 in Experimental Example 1, respectively.

In the same way as in Experimental Example 1, the second electrode 4 shown in FIG. 2 which formed an ohmic contact with the $Nb:SrTiO_3$ single crystal substrate was formed.

For the obtained samples, the resistance variation ratio and the pulse voltage response characteristics were evaluated in the same way as in Experimental Example 1.

Additionally, in Experimental Example 2, as shown in the column "Resistance memory characteristics" of Table 2, the evaluation of the resistance memory characteristics was performed at a room temperature. The resistance memory characteristics was evaluated as follows: the voltage was applied to switch the high resistance state or the low resistance state, after which, the current was measured for 1 hour at +0.5 V every 10 seconds at each of the resistances. The samples of which the resistance variation ratio ΔR measured at +0.5 V after 1 hour between the high resistance and the low resistance is 20 or more were judged as being accepted, while the samples of which that is less than 20 were judged as being rejected. In the column "Resistance memory characteristics" of Table 2, among the samples which were judged as being accepted, the samples of which the resistance variation ratio ΔR was 100 or more are indicated as "⊚", the samples of which the resistance variation ratio ΔR was 20 or more and less than 100 are indicated as "○", and the rejected samples of which the resistance variation ratio ΔR was less than 20 are indicated as "X".

TABLE 2

| | Lower layer | | Upper layer | | Resistance Variation Characteristics | | Resistance Memory Characteristics |
|---|---|---|---|---|---|---|---|
| Sample No. | $Ar/O_2$ ratio | Thickness (nm) | $Ar/O_2$ ratio | Thickness (nm) | ΔR | Response Characteristics | |
| 11 | 10/0.5 | 1 | 10/0 | 200 | 254000 | 100 μsec | ⊚ |
| 12 | 10/0.5 | 10 | 10/0 | 190 | 243000 | 100 μsec | ⊚ |
| 13 | 10/0.5 | 30 | 10/0 | 170 | 280000 | 100 μsec | ⊚ |
| 14 | 10/0.5 | 50 | 10/0 | 150 | 215000 | 100 μsec | ⊚ |
| 15 | 10/0.5 | 200 | 10/0 | 0 | 152000 | 100 μsec | ○ |
| 16 | 10/5 | 1 | 10/0 | 200 | 265000 | 100 μsec | ⊚ |
| 17 | 10/5 | 10 | 10/0 | 190 | 275000 | 100 μsec | ⊚ |
| 18 | 10/5 | 30 | 10/0 | 170 | 239000 | 100 μsec | ⊚ |
| 19 | 10/5 | 50 | 10/0 | 150 | 210000 | 100 μsec | ⊚ |
| 20 | 10/5 | 200 | 10/0 | 0 | 70000 | 100 μsec | ○ |
| 1 | 10/0 | 200 | 10/0 | 0 | 30000 | 100 msec | X |

In Table 2, the evaluation result of Sample 1 as a conventional example produced in Experimental Example 1 is also shown.

As seen from Table 2, Samples 15 and 20 having the first electrode containing the oxide of Pt wherein the whole layer was formed by using the same Ar/O$_2$ ratio throughout its thickness of 200 nm achieved the resistance variation ratio ΔR of 1,000 or more and the good response characteristics, and was judged as being "○" for the resistance memory characteristics.

However, for the samples, such as Samples 11-14 and 16-19, having a structure of the layer comprising Pt/the layer in which the oxide of Pt or Pt containing oxygen is present/the n-type semiconductor, the resistance variation ratio ΔR was further improved to be 200,000 or more, and the resistance memory characteristics was evaluated to be very superior "⊚".

In contrast, for Sample 1, the resistance variation ratio ΔR and the response characteristics were low, and the resistance memory characteristics was evaluated to be "X". Therefore, it obviously has many problems for an actual use.

Figure 13:
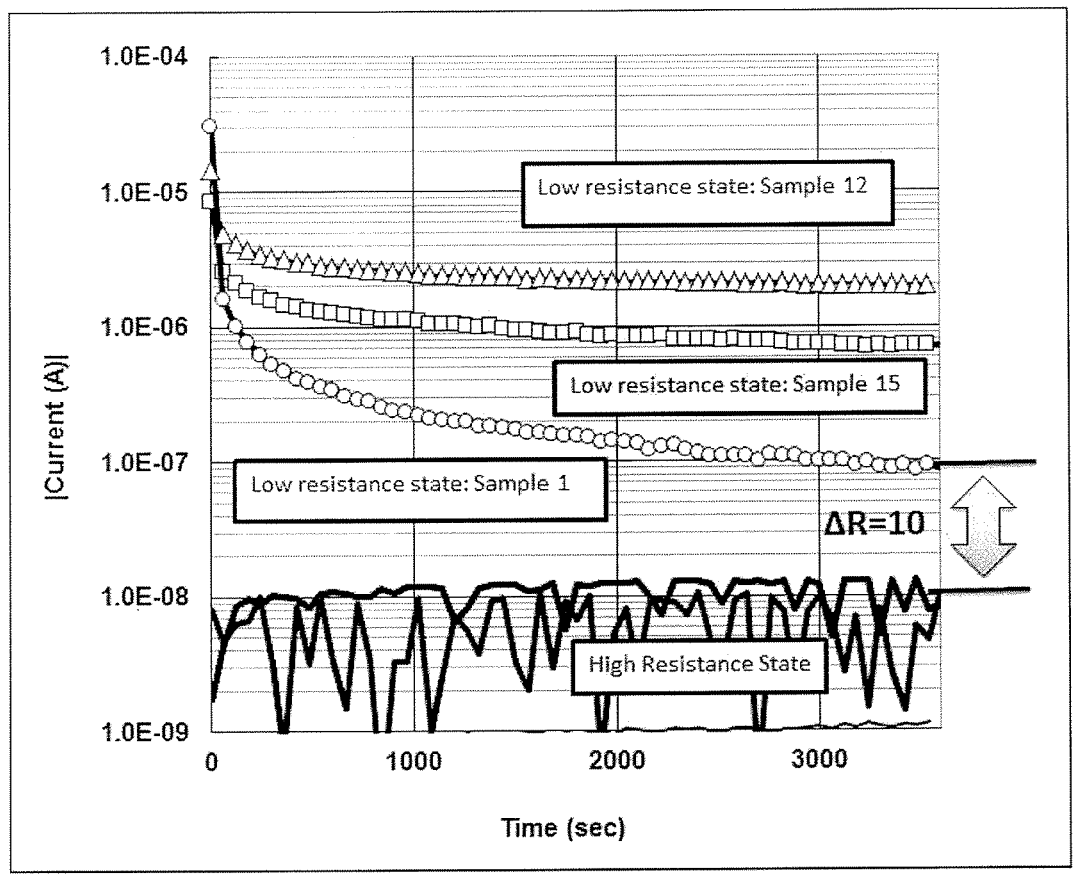
FIG. 13 is a graph contrastively showing the resistance memory characteristics of Sample 1 produced in Experimental Example 1 as a conventional example and Samples 12 and 15 produced in Experimental Example 2.

FIG. 13 shows the resistance memory characteristics for Sample 1 as a conventional example and Samples 12 and 15 within the scope of the present invention as representative examples.

As described above as the problem to be solved by the invention, Sample 1 has the problem that the low resistance state approaches the high resistance state with time, and the resistance variation ratio ΔR becomes to be low, about 10, after 1 hour even at a room temperature. Therefore, it is suggested that when it is used as a memory device, the date which is memorized as a low resistance state can be disappeared with time.

On the other hand, Sample 15 within the scope of the present invention has the resistance variation ratio ΔR of about 60 after 1 hour, and Sample 12 having the structure of the layer comprising Pt/the layer in which the oxide of Pt or Pt containing oxygen is present/the n-type semiconductor has the further improved ΔR of about 150. It is seen from these results that, according to the present invention, the resistance memory characteristics is improved, in particular, when the structure of the layer comprising Pt/the layer in which the oxide of Pt or Pt containing oxygen is present/the n-type semiconductor is applied, the resistance memory characteristics is further improved.

Though a principle for the above phenomenon is unclear, it can be assumed as follows. The oxide of Pt or Pt containing oxygen is relatively permeable to oxygen while Pt is not permeable to oxygen. Therefore, by the formation of the Pt electrode on the oxygen-containing layer formed from the oxide of Pt or Pt containing oxygen, oxygen moved from the oxide of Pt or Pt containing oxygen remains at the interface between the oxygen-containing layer and the Nb:SrTiO$_3$ single crystal substrate, thereby improving the characteristics.

When Au is used in place of Pt, the above described matter is applied.

EXPERIMENTAL EXAMPLE 3

In Experimental Example 3, Samples 21-24 were produced wherein rutile-type TiO$_2$ (especially, Nb of 0.5 wt % adding TiO$_2$ (100) single crystal substrate manufactured by SHINKOSHA Co., Ltd.) was used as the n-type oxide semiconductor 2 in the resistance switching device 1 or 1a having the structure shown in FIG. 1A or FIG. 2. Samples 22 and 24 had an electrode having a monolayer structure similar to the first electrode 3 shown in FIG. 1A, and Samples 23 and 25 had an electrode having the lower layer 5 and the upper layer 6 similar to the first electrode 3 shown in FIG. 2.

Furthermore, in Experimental Example 3, Samples 25-32 were produced wherein as a material of the n-type oxide semiconductor thin layer 7 in the resistance switching device 1b having the structure shown in FIG. 3, anatase-type TiO$_2$ was used in Samples 25-28 and BaTiO$_3$ was used in Samples 29-32, and this thin layer was formed on the n-type oxide semiconductor substrate 8 comprising the same Nb:SrTiO$_3$ single crystal substrate as that in Experimental Example 1 by using the pulse laser ablation. Two types of samples were formed as the first electrode 3 shown in FIG. 3. One type of the first electrode had a monolayer structure similar to the first electrode 3 shown in FIG. 1A (Samples 26, 28, 30 and 32), and the other type of electrode comprises the lower layer 5 and the upper layer 6 similar to the first electrode 3 shown in FIG. 2 (Samples 25, 27, 29 and 31).

The conditions for forming the thin layer comprising BaTiO$_3$ and the thin layer comprising anatase-type TiO$_2$ are shown in Table 3.

TABLE 3

|  | BaTiO$_3$ thin layer | Anatase-type TiO$_2$ thin layer |
| --- | --- | --- |
| Substrate temperature | 750° C. | 600° C. |
| Oxygen partial pressure | 1 mPa | 13 Pa |
| Target | BaTiO$_3$ ceramic | rutile-type TiO$_2$ ceramic |
| Laser type | KrF | KrF |
| Laser power | 140 mJ | 140 mJ |
| Laser frequency | 5 Hz | 10 Hz |
| Thickness | 250 nm | 250 nm |

In the same way as in Experimental Example 1 or 2, the second electrodes 4 shown in FIGS. 1A, 2 and 3 which formed an ohmic contact with the rutile-type TiO$_2$ substrate or the Nb:SrTiO$_3$ single crystal substrate were formed.

Then, the same evaluations as that of Experimental Example 2 were performed. The results are shown in FIG. 4.

TABLE 4

| | | Lower layer | | Upper layer | | Resistance Variation Characteristics | | Resistance |
| --- | --- | --- | --- | --- | --- | --- | --- | --- |
| Sample No. | n-type semiconductor | Ar/O$_2$ ratio | Thickness (nm) | Ar/O$_2$ ratio | Thickness (nm) | ΔR | Response Characteristics | Memory Characteristics |
| 21 | Nb: 0.5 wt %-doped TiO$_3$ (rutile) | 10/0.5 | 1 | 10/0 | 200 | 3600 | 100 μsec | ⊚ |

TABLE 4-continued

| Sample No. | n-type semiconductor | Lower layer Ar/O$_2$ ratio | Thickness (nm) | Upper layer Ar/O$_2$ ratio | Thickness (nm) | Resistance Variation Characteristics ΔR | Response Characteristics | Resistance Memory Characteristics |
|---|---|---|---|---|---|---|---|---|
| 22 | Nb: 0.5 wt %-doped TiO$_3$ (rutile) | 10/0.5 | 200 | 10/0 | 0 | 2900 | 100 μsec | ○ |
| 23 | Nb: 0.5 wt %-doped TiO$_3$ (rutile) | 10/5 | 1 | 10/0 | 200 | 3700 | 100 μsec | ◎ |
| 24 | Nb: 0.5 wt %-doped TiO$_3$ (rutile) | 10/5 | 200 | 10/0 | 0 | 2700 | 100 μsec | ○ |
| 25 | TiO$_2$ anatase thin layer | 10/0.5 | 1 | 10/0 | 200 | 4200 | 100 μsec | ◎ |
| 26 | TiO$_2$ anatase thin layer | 10/0.5 | 200 | 10/0 | 0 | 2600 | 100 μsec | ○ |
| 27 | TiO$_2$ anatase thin layer | 10/5 | 1 | 10/0 | 200 | 4150 | 100 μsec | ◎ |
| 28 | TiO$_2$ anatase thin layer | 10/5 | 200 | 10/0 | 0 | 2200 | 100 μsec | ○ |
| 29 | BaTiO$_3$ thin layer | 10/0.5 | 1 | 10/0 | 200 | 5300 | 100 μsec | ◎ |
| 30 | BaTiO$_3$ thin layer | 10/0.5 | 200 | 10/0 | 0 | 2800 | 100 μsec | ○ |
| 31 | BaTiO$_3$ thin layer | 10/5 | 1 | 10/0 | 200 | 4500 | 100 μsec | ◎ |
| 32 | BaTiO$_3$ thin layer | 10/5 | 200 | 10/0 | 0 | 2600 | 100 μsec | ○ |

As seen from Table 4, compared with the samples using the Nb:SrTiO$_3$ single crystal substrate shown in Tables 1 and 2, it is confirmed that the resistance variation ratio ΔR which was obtained from the current-voltage characteristics decreased while all samples had the good resistance variation ratio ΔR of 1,000 or more and the superior response characteristics of 100 μsec as well as the superior resistance memory characteristics.

It is said from this that the present invention can be applied to not only the Nb:SrTiO$_3$ single crystal but also the materials described herein which form the Schottky barrier with the oxygen-containing layer formed the oxide of Pt or Pt containing oxygen. Though a principal of action of the resistance variation phenomenon is still unclear, the resistance variation phenomenon is well known to appear at the interface between the n-type oxide semiconductor and the electrode forming the Schottky barrier, and the n-type oxide semiconductor Schottky barrier is formed when the work function of the electrode is larger than the work function of the semiconductor. Generally, since the work function of Pt is larger than that of the n-type oxide semiconductor, the Schottky barrier is formed in nearly all the n-type oxide semiconductor, and the resistance variation phenomenon is find in many of the devices although there is a difference of the resistance variation. In fact, other some Schottky junction devices of the n-type oxide semiconductors and the Pt electrode have been reported to express the resistance variation phenomenon, and since the principal of action is the same, it can be expected that these devices have the similar effect. Examples of the applicable n-type oxide semiconductor include, for example, In$_2$O$_3$, Ga$_2$O$_3$, ZnO and a compound thereof.

EXPERIMENTAL EXAMPLE 4

In Experimental Example 4, a ruthenium oxide (RuO$_x$) electrode was formed by using the DC sputtering in place of the oxygen-containing layer which was formed from the oxide of Pt or Pt containing oxygen and its characteristics were evaluated in order to investigate the reason of the improvement of characteristics by the formation of the electrode having the oxygen-containing layer which was formed from the oxide of Pt or Pt containing oxygen, which was a feature of the present invention.

For the formation of the RuO$_x$ electrode, the layer was formed by the DC sputtering using a Ru metal target under the condition: Ar/O$_2$=10/5 and 5 mTorr, such that the thickness was 200 nm. The reason for selecting RuO$_x$ is that Ru is very easily oxidizable in comparison with Pt, and the oxide of Pt decomposes into Pt metal and the oxygen of Pt begins to decompose and separate into a Pt metal and oxygen from about 400° C. while RuO$_x$ is very stable even at the temperature of about 1,000° C.

Figure 14:
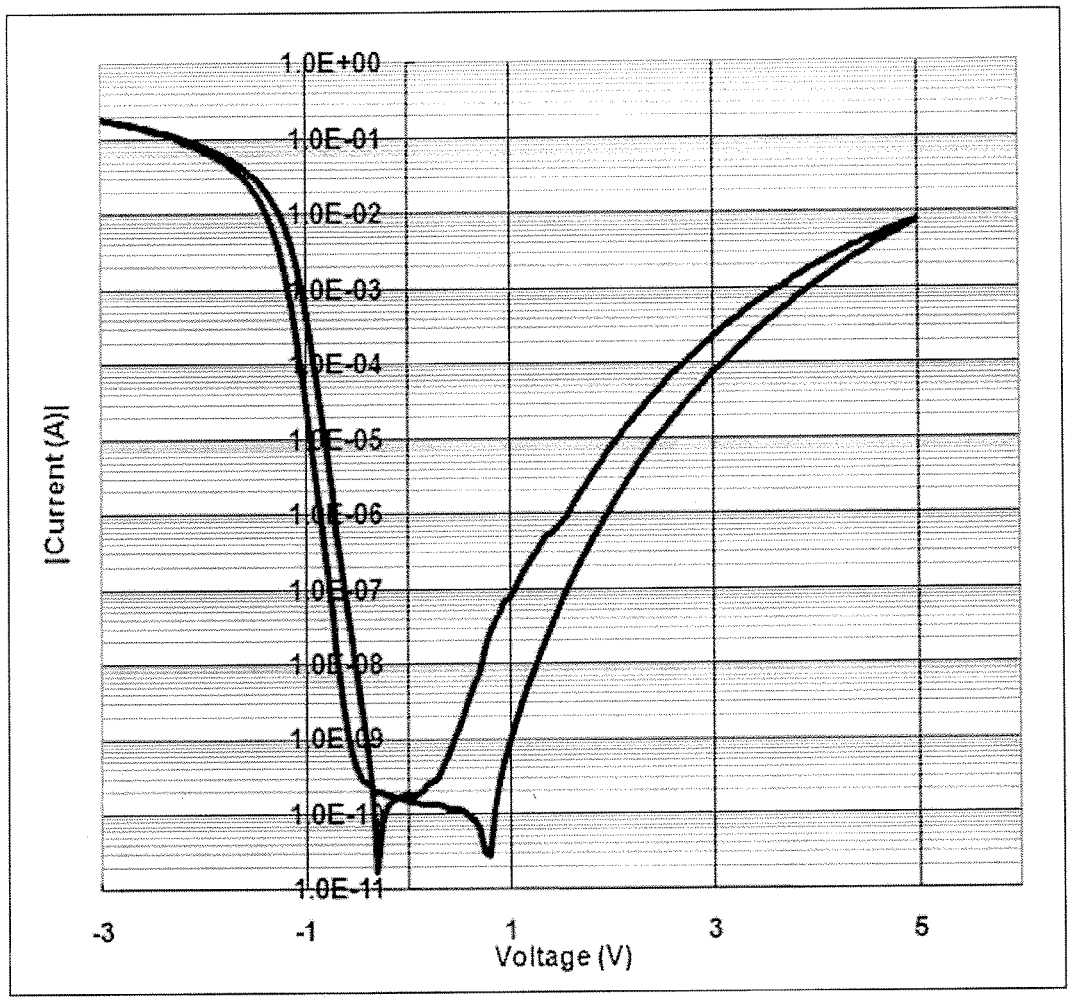
FIG. 14 is a graph showing the current-voltage characteristics of a sample having a $RuO_x/Nb:SrTiO_3$ structure produced in Experimental Example 4 as a comparative example.

As shown in FIG. 14, in the sample having the RuO$_x$/Nb:SrTiO$_3$ structure in which the RuO$_x$ electrode was formed, the hysteresis was very small, and the resistance variation ratio extremely decreased. Though the reason for this is unclear because the principal of action is until unclear, some models have been suggested in order to explain the principal of this resistance variation phenomenon, among them, there is a model in which an oxygen defect moves or oxygen moves between an electrode and a semiconductor. It is assumed from this that since the oxygen defect on the surface of Nb:SrTiO$_3$ is filled during the formation of RuO$_x$ or oxygen cannot move due to the strong bonding of RuO$_x$ itself to oxygen, the degree of the resistance variation extremely decreases.

According to the structure of the sample shown in Experimental Example 2, when an electrode having a multiple layers structure such as Ru (200 nm)/RuO$_x$ (1 nm)/Nb:SrTiO$_3$ was formed, the hysteresis definitely appears and the superior characteristics having a good response characteristics was obtained similar to the samples according to the present invention. However, the voltage pulse on/off switching resistance evaluation was performed, and the result shown in FIG. 15 was obtained. For comparison, the result of the on/off switching resistance evaluation for Sample 12 in Experimental Example 2 as a sample within the scope of the present invention is shown in FIG. 16.

Figure 15:
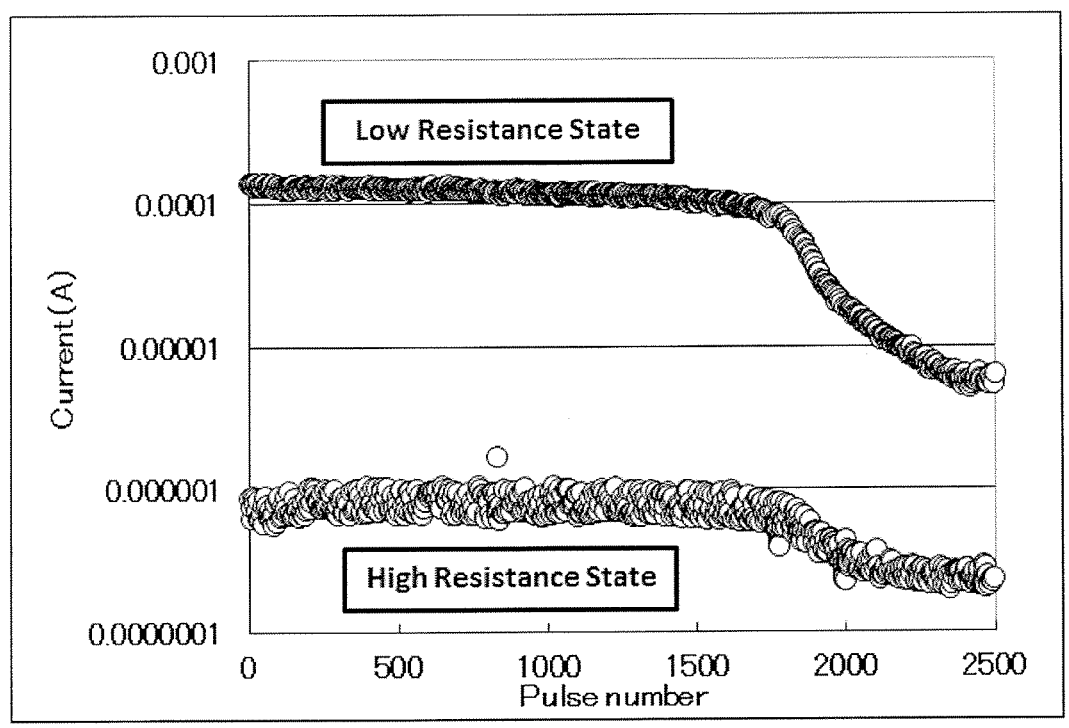
FIG. 15 is a graph showing an evaluation result of an on/off switching resistance of a sample having aRu (200 nm)/$RuO_x$ (1 nm)/$Nb:SrTiO_3$ structure produced in Experimental Example 4 as a comparative example.
Figure 16:
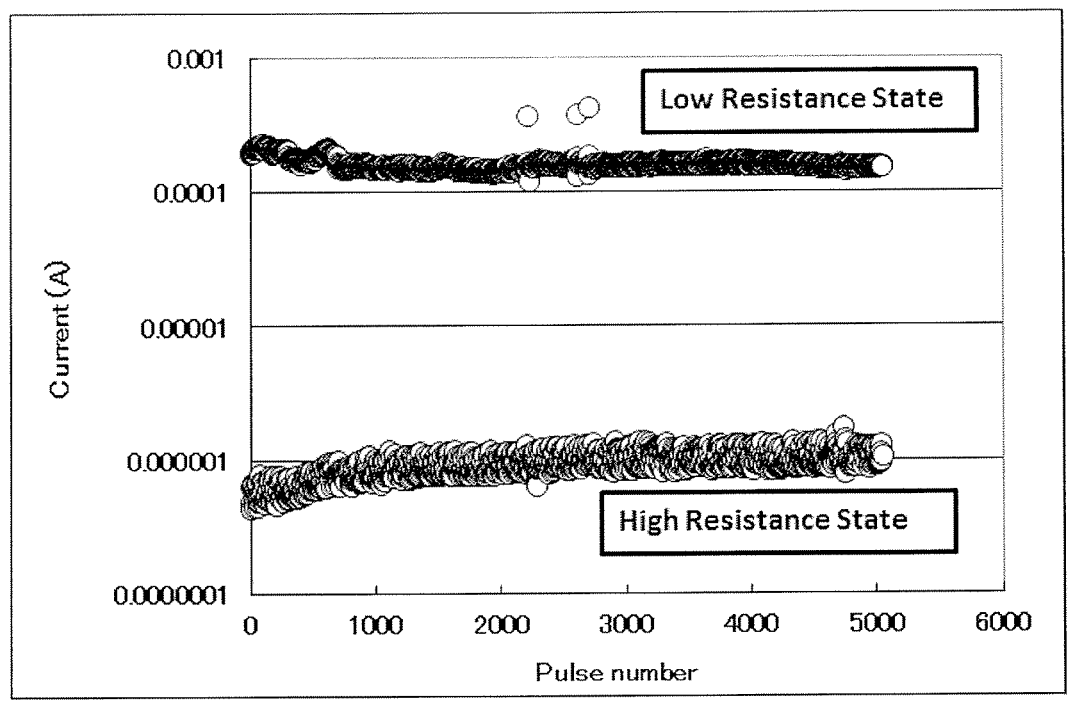
FIG. 16 is a graph showing an evaluation result of the on/off switching resistance of Sample 12 within the scope of the present invention produced in Experimental Example 2.

As shown in FIG. 16, for Sample 12 within the scope of the present invention, the resistance variation ratio ΔR at 5,000 of the on/off switchings was about 100 and the superior variation ratio and the superior resistance were shown while, as shown in FIG. 15, for the device having the $Ru/RuO_x/Nb:SrTiO_3$ structure, the resistance variation characteristics began to deteriorate at 2,000 of the on/off switchings, and a stable switching and resistance could be obtained. It is assumed that a reason for this is that since $RuO_x$ is very easily oxidizable and stable in comparison with the oxide of Pt, the characteristics deterioration was caused by the repeating switching.

EXPERIMENTAL EXAMPLE 5

In order to investigate the reason of the effects of the present invention, the Schottky barrier height was evaluated by using the XPS equipment in which the Schottky barrier was formed at the interface between the electrode (hereinafter referred to as "$PtO_x$ electrode") having the oxygen-containing layer formed from the oxide of Pt or Pt containing oxygen and $Nb:SrTiO_3$.

Thought there are various theories as to the reason of the resistance variation phenomenon, it is assumed that the change of the amount of the current passing through the Schottky barrier involves, therefore, the Schottky barrier height, etc. are changed by the replace of the Pt electrode with the $PtO_x$ electrode.

A $Pt/Nb:SrTiO_3$ component and a $PtO_x/Nb:SrTiO_3$ component were produced under the condition ($Ar/O_2$ ratio, total pressure) for forming the layer in each of Sample 1 (without the scope of the present invention) and Sample 4 (within the scope of the present invention) produced in Experimental Example 1, respectively. An electrode was formed on the entire surface of the $Nb:SrTiO_3$ substrate such that its thickness was about 3 nm, a Al-Kα ray was irradiated to the electrode surface, and an electron state at the interface between the electrode and $Nb:SrTiO_3$ was evaluated.

The evaluation was performed in the same way as described in "Barrier height at $(Ba,Sr)TiO_3$/Pt interfaces studied by photoemission" PHYSICAL REVIEW B 77, 195310 (2008).

Figure 17:
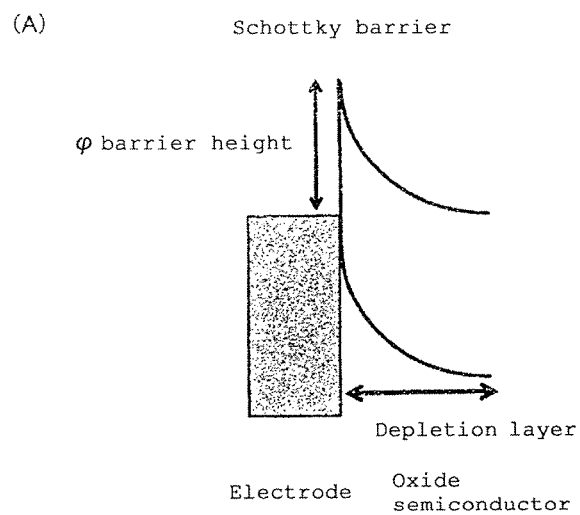
FIG. 17(A) schematically shows the Schottky barrier.
FIG. 17(B) is a drawing to explain how an x-ray passes through a thin electrode and photoelectrons are released which reflects an electron state in the n-type oxide semiconductor near the interface when an XPS is used in order to obtain information in the vicinity of the electrode interface in the Schottky barrier shown in FIG. 17(A).
Figure 17:
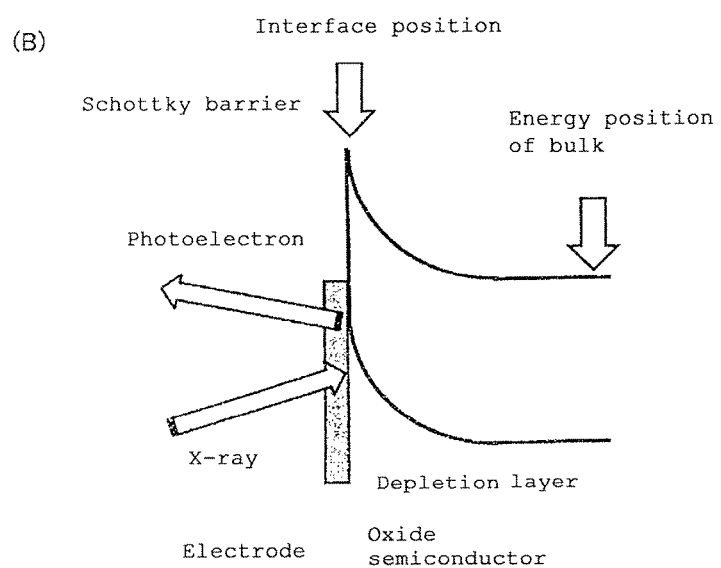

As shown in FIG. 17(A), since the Schottky barrier are formed at the interface between the electrode and the n-type oxide semiconductor ($Nb:SrTiO_3$), the band of $Nb:SrTiO_3$ near the interface is bending. In this evaluation using the XPS, as shown in FIG. 17(B), when the Al-Kα X-ray is irradiated to the $Nb:SrTiO_3$ substrate which is covered with a thin electrode, the X-ray passes through the thin electrode, and is irradiated to the $Nb:SrTiO_3$, and photoelectrons which reflects the electron state of $Nb:SrTiO_3$ near the interface are released. The information of the bending of the band in the interface can be obtained by the measurement of the photoelectrons by an analyzer. Since the information of the comparatively deep position cannot be obtained by the Al-Kα ray, the information of $Nb:SrTiO_3$ via the electrode having the thickness of about 3 nm is information nearly the electrode interface.

In this Experimental Example, the energy position of the Ti2p orbital was evaluated and the comparison of it with the energy position of the Ti2p of the $Nb:SrTiO_3$ single crystal on which an electrode does not form was performed to evaluate the barrier height. It is noted that in this evaluation, a Fermi position, a position of a valence band, and a position of a C1s orbital were also measured, and no effect of a charge up was confirmed.

Figure 18:
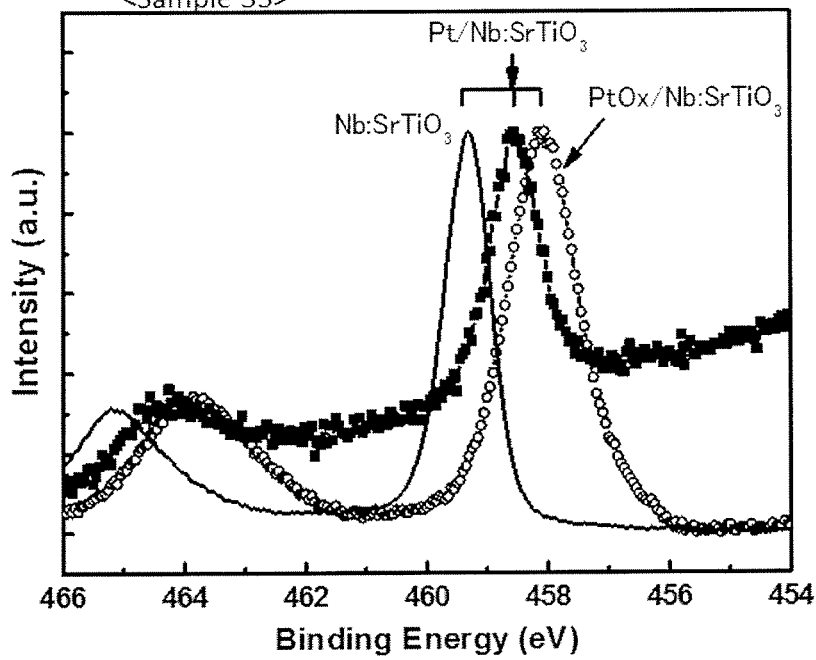
FIG. 18 is a graph contrastively showing a result of the state analysis of a $Pt/Nb:SrTiO_3$ component and a $PtO_x/Nb:SrTiO_3$ component produced in Experimental Example 5 by a photoelectron spectroscopy.

FIG. 18 shows the XPS spectra of the $Nb:SrTiO_3$ single crystal on which the electrode was formed, the $Pt/Nb:SrTiO_3$ component and the $PtO_x/Nb:SrTiO_3$ component which were produced under the same condition (the $Ar/O_2$ ratio, the total pressure) of forming the layer as in Samples 1 and 4, respectively.

As seen from FIG. 18, for the $Pt/Nb:SrTiO_3$ component (corresponding to Sample 1), the peak top of the Ti2p orbital shifts to a lower energy side by about 0.7 eV, thus the Schottky barrier height is found to be about 0.7 eV. On the other hand, for the $PtO_x/Nb:SrTiO_3$ component (corresponding to Sample 4) within the scope of the present invention, an amount of the shift is large to be about 1.3 eV, therefore, it is recognized that the Schottky barrier becomes higher by the change into $PtO_x$.

In Experimental Example 1, in the results of the evaluation for the Pt4f orbital by the XPS, the tendency was found that the oxidization of Pt was progressed in proportion to the oxygen flow ratio (oxygen partial pressure) during the formation of the electrode, and the production of $PtO_x$ increased with increasing the oxygen flow ratio. On the other hand, in this evaluation, as long as the sample is within the scope of the present invention, the estimated barrier height is not significantly changed and is about 1.3 eV, and the correlation with the oxygen flow ratio was not particularly found.

At this time, though the reason for this is unclear, it is assumed as follows: the barrier height is determined by the work function of the electrode and the n-type oxide semiconductor at the junction interface; the work function is changed even by the thin oxidation of the electrode surface in contact with the n-type oxide semiconductor or a adsorption of oxygen, thereby changing the barrier height; therefore, only the Pt electrode at the junction interface was sufficiently oxidized or sufficiently adsorbed oxygen, thus, the Schottky barrier heights are substantially same in Samples within the scope of the present invention. In the evaluation of the Experimental Example 1, since the evaluation with the XPS was performed for the relatively thick electrode, there is a possibility that the information of near the interface is not sufficiently reflected.

From the above results, it is recognized that one of the reasons that the resistance variation can be sufficiently improved by use of the $PtO_x$ electrode is possibly associated with the higher Schottky barrier.

EXPERIMENTAL EXAMPLE 6

In Experimental Example 6, samples wherein an electrode forming the Schottky junction was formed on the Nb (0.5 wt %) adding $SrTiO_3$ (100) single crystal substrate manufacture by Furuuchi Chemical Corporation were produced by using the DC sputtering apparatus in the same way as in Experimental Example 1 except for using an Au target and a Ir target in place of the Pt target, respectively. The conditions for forming the electrode with the Au target are shown in Table 5, and the conditions for forming the electrode with the Ir target are shown in Table 6.

The characteristics test for the produced samples was performed in the same way as in Experimental Example 2. Similarly to Experimental Example 2, also in Experimental Example 6, the samples of which the resistance variation ratio ΔR is 1,000 or more, the response rate is 100 μsec, and the resistance variation ratio ΔR measured at +0.5 V after 1 hour at the high resistance and the low resistance is 20 or more were judged as being accepted, while the samples of which that is less than 20 were judged as being rejected. Samples 34-37 and 39-42 were judged as being accepted, and for these samples, "oxygen partial pressure" is within the range of 0.01-0.22 Pa.

Similarly to Experimental Example 2, in the column "Resistance memory characteristics" of Table 5 and Table 6, among the samples which were judged as being accepted, the samples of which the resistance variation ratio ΔR was 100 or more are indicated as "⊚", the samples of which the resistance variation ratio ΔR was 20 or more and less than 100 are indicated as "○", and the rejected samples of which the resistance variation ratio ΔR was less than 20 are indicated as "X".

TABLE 5

| Sample No. | Formation Condition and State of the Electrode | | | Resistance Variation Characteristics | | Resistance Memory Characteristics |
|---|---|---|---|---|---|---|
| | Ar/O₂ ratio | Total pressure (Pa) | Oxygen Partial Pressure (Pa) | ΔR | Response Characteristics | |
| 33 | 10/0 | 0.67 | — | 30000 | 100 msec | X |
| 34 | 10/0.5 | 0.67 | 0.03 | 320000 | 100 μsec | ⊚ |
| 35 | 10/1 | 0.67 | 0.06 | 1240000 | 100 μsec | ⊚ |
| 36 | 10/3 | 0.67 | 0.15 | 4300000 | 100 μsec | ⊚ |
| 37 | 10/5 | 0.67 | 0.22 | 111000 | 100 μsec | ⊚ |
| 38 | 10/10 | 0.67 | 0.34 | 310 | 10 msec | X |
| 39 | 24/1 | 0.25 | 0.01 | 260000 | 100 μsec | ⊚ |
| 40 | 22/3 | 0.25 | 0.03 | 366000 | 100 μsec | ⊚ |
| 41 | 20/5 | 0.25 | 0.05 | 830000 | 100 μsec | ⊚ |
| 42 | 10/15 | 0.25 | 0.15 | 328000 | 100 μsec | ⊚ |

TABLE 6

| Sample No. | Formation Condition and State of the Electrode | | | Resistance Variation Characteristics | | Resistance Memory Characteristics |
|---|---|---|---|---|---|---|
| | Ar/O₂ ratio | Total pressure (Pa) | Oxygen Partial Pressure (Pa) | ΔR | Response Characteristics | |
| 43 | 10/0 | 0.67 | — | 40 | 100 msec | X |
| 44 | 10/0.5 | 0.67 | 0.03 | — | — | X |
| 45 | 10/1 | 0.67 | 0.06 | — | — | X |

Figure 19:
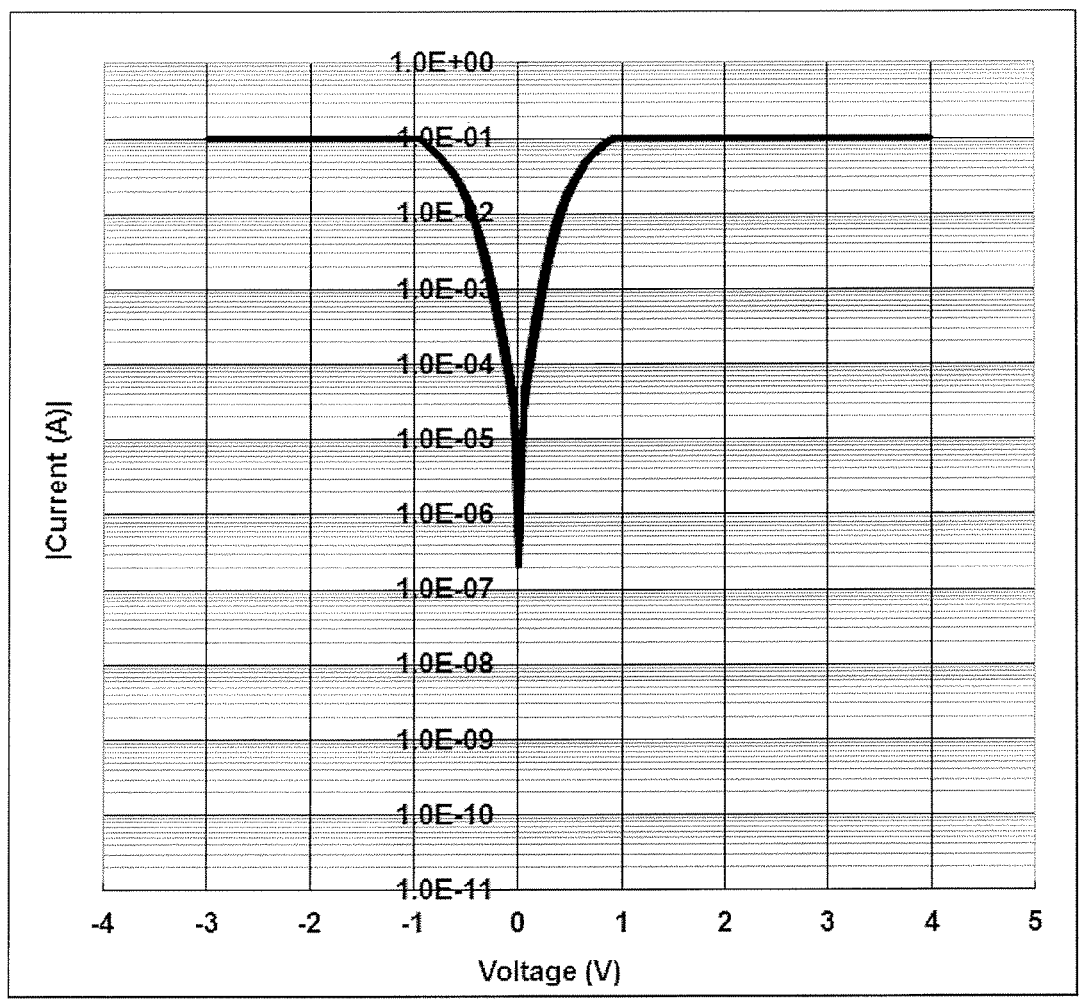
FIG. 19 is a graph showing the current-voltage characteristics of Sample 33 produced in Experimental Example 6 as a comparative example.
Figure 20:
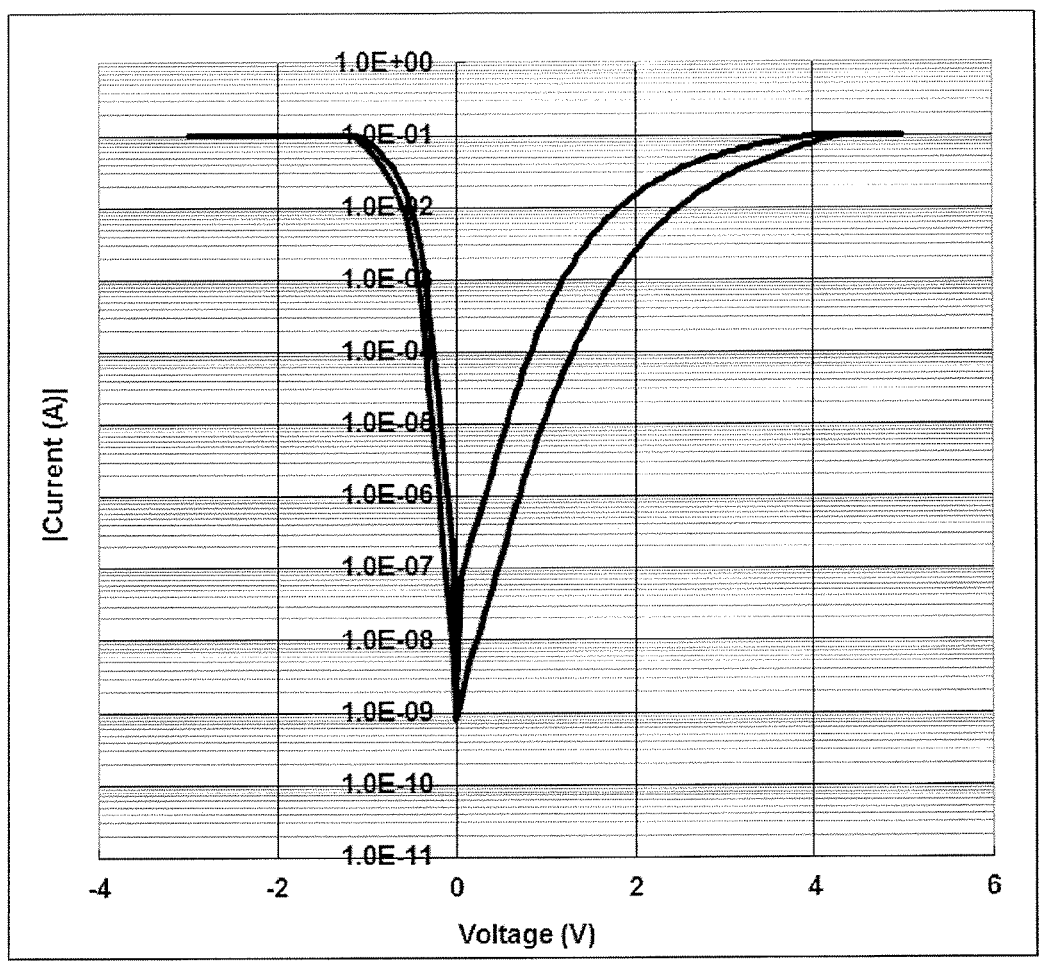
FIG. 20 is a graph showing the current-voltage characteristics of Sample 43 produced in Experimental Example 6 as a comparative example.

The current-voltage characteristics of Samples 33 and 34 are representatively shown in FIGS. 19 and 20, respectively.

When the electrode was formed under the atmosphere of Ar (Ar/O₂=10/0) after pre-sputtering was sufficiently performed, for Sample 33 having the Au electrode, the hysteresis could not be found, and also very low rectifying characteristics could be obtained. On the other hand, for Sample 43 having the Ir electrode, the hysteresis was found though it is very small in comparison with the Pt electrode, and the resistance variation ratio was 40. It is recognized from this that the Au electrode and the Ir electrode cannot provide the sufficient resistance variation characteristics.

Figure 21:
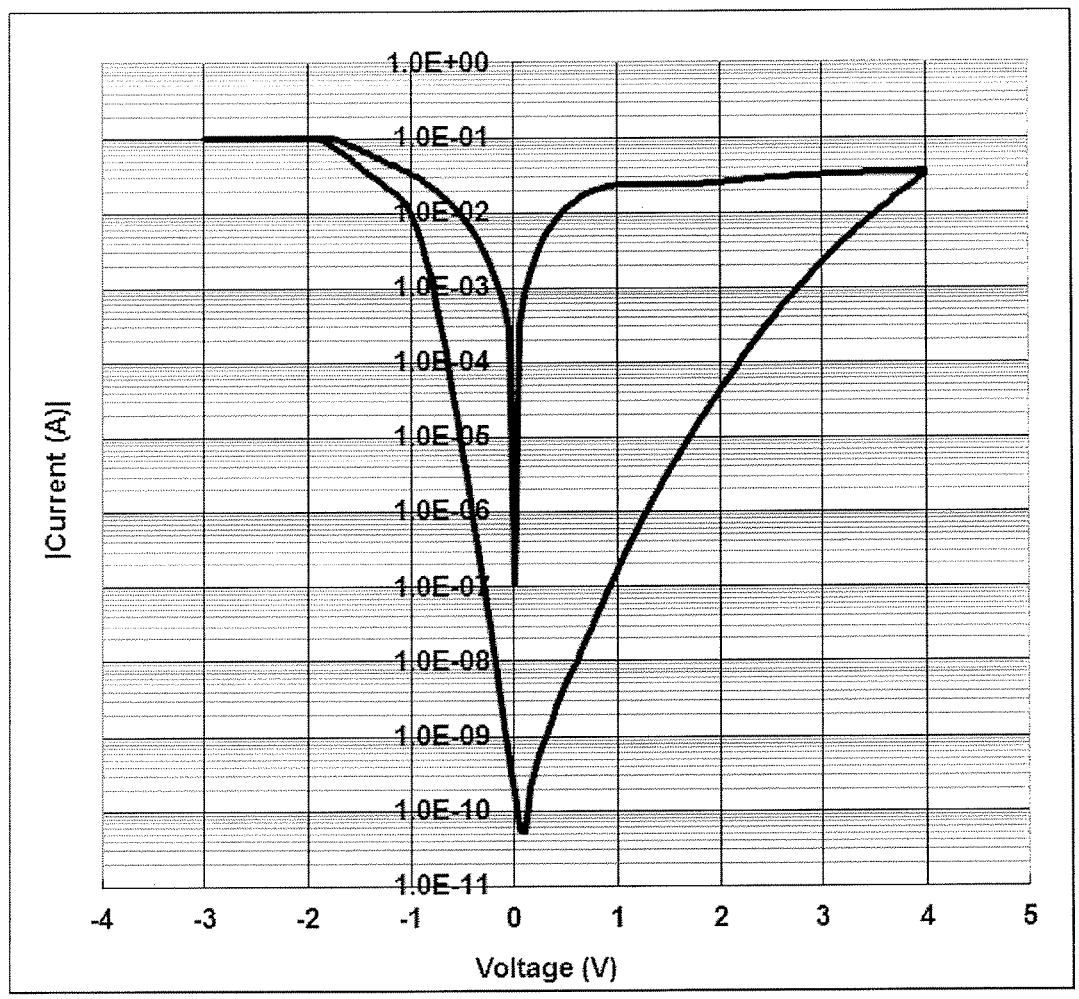
FIG. 21 is a graph showing the current-voltage characteristics of Sample 36 within the scope of the present invention produced in Experimental Example 6.
Figure 22:
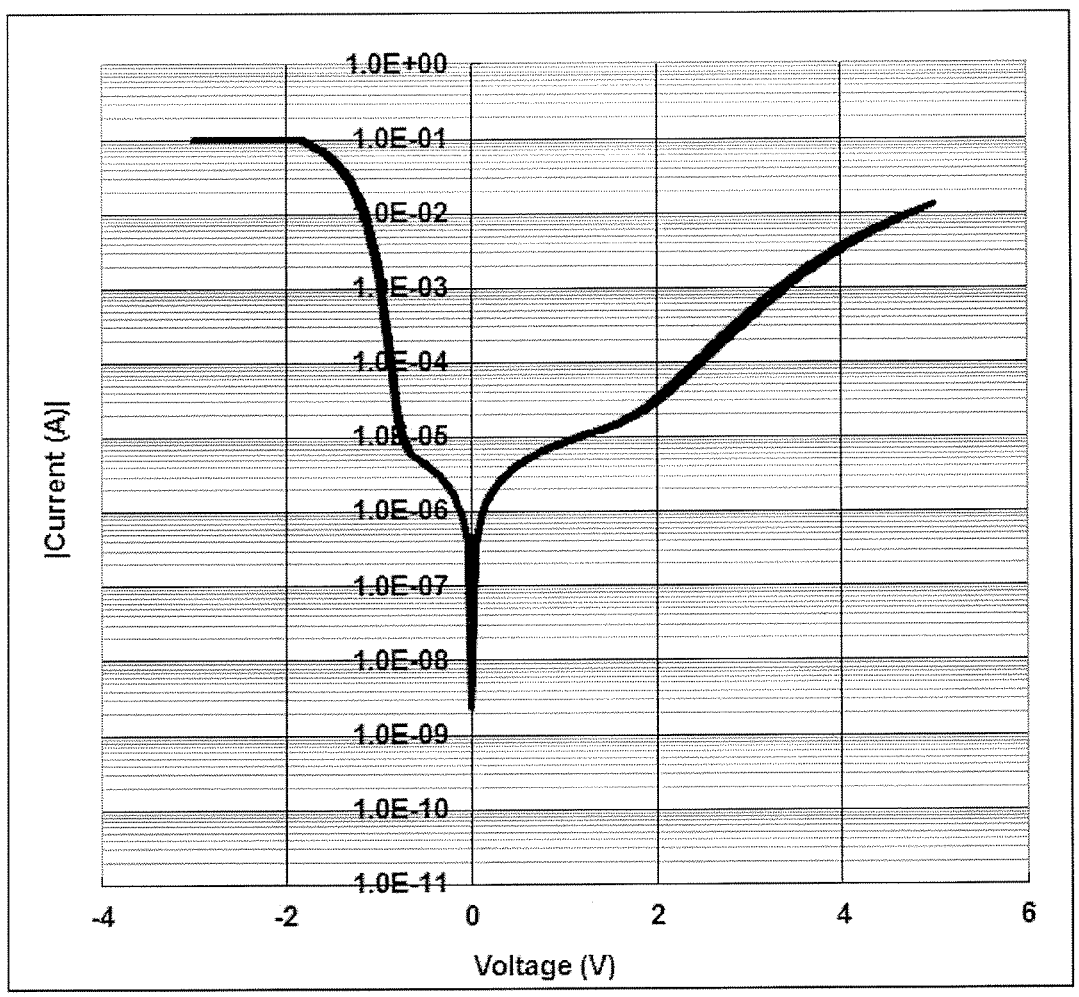
FIG. 22 is a graph showing the current-voltage characteristics of Sample 45 produced in Experimental Example 6 as a comparative example.

The current-voltage characteristics of Sample 36 and Sample 45 are shown in FIG. 21 and FIG. 22, respectively. As Sample 36 (Ar/O₂=10/3), when oxygen was introduced during the formation of the Au electrode, the very large hysteresis was expressed as shown FIG. 21, thus, the large resistance variation characteristics could be obtained.

On the other hand, for the Ir electrode, when the formation of the electrode was performed in the present of oxygen, the hysteresis was almost-entirely disappear as shown in FIG. 22, thus the resistance variation phenomenon became not to be expressed. It is recognized from this that for the Au electrode, the very large resistance variation characteristics can be obtained by the introduction of oxygen during the sputtering.

Also, for the Au electrode, the response characteristics and the resistance memory characteristics were obtained comparable to or superior to those of the PtO$_x$ electrode.

It is noted that for Sample 38 in Table 5, the electrode was formed under the condition that the oxygen flow ratio was high (high oxygen partial pressure), and its resistance variation ratio is small to be 310 . Though this definite reason is unclear, it is assumed that the compactness of the electrode decreased or the surface of the n-type oxide semiconductor (Nb:SrTiO₃) was damaged by an oxygen plasma during the formation of the electrode.

Next, the Au electrodes having the thickness of 3 nm were produced in the same condition as of Sample 33 and Sample 36, respectively. For the samples, the barrier height and the oxidation state of Au were evaluated with the XPS in the same way as in Experimental Example 1 or 5.

Figure 23:
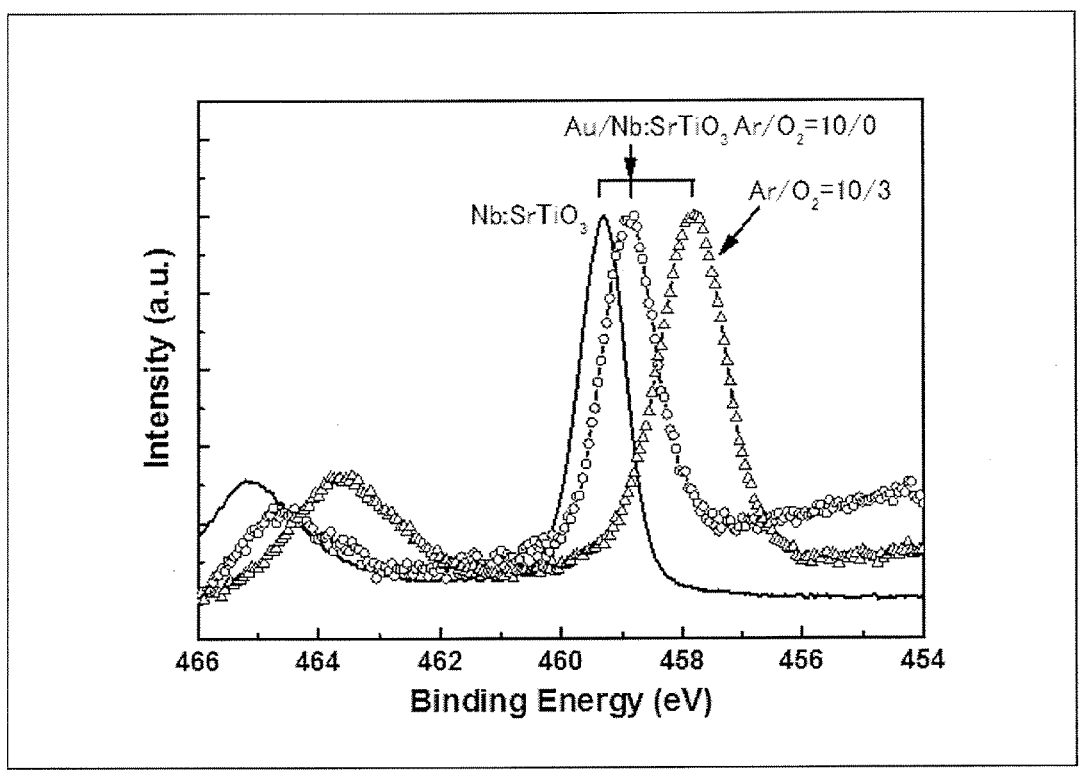
FIG. 23 is a graph contrastively showing results of the state analysis of a Ti2p orbital for each of components produced under the same conditions as that of Sample 33 and Sample 36 produced in Experimental Example 6 by a photoelectron spectroscopy.

With reference to FIG. 23, similarly to the Pt electrode or the PtO$_x$ electrode, for the Au electrode which was formed under the Ar atmosphere (Ar/O₂=10/0), its barrier height is 0.5 eV which is little lower than Pt, while by the formation with the oxygen introduction (for example, Ar/O₂=10/3) the barrier height is very high to be about 1.5 eV.

Figure 24:
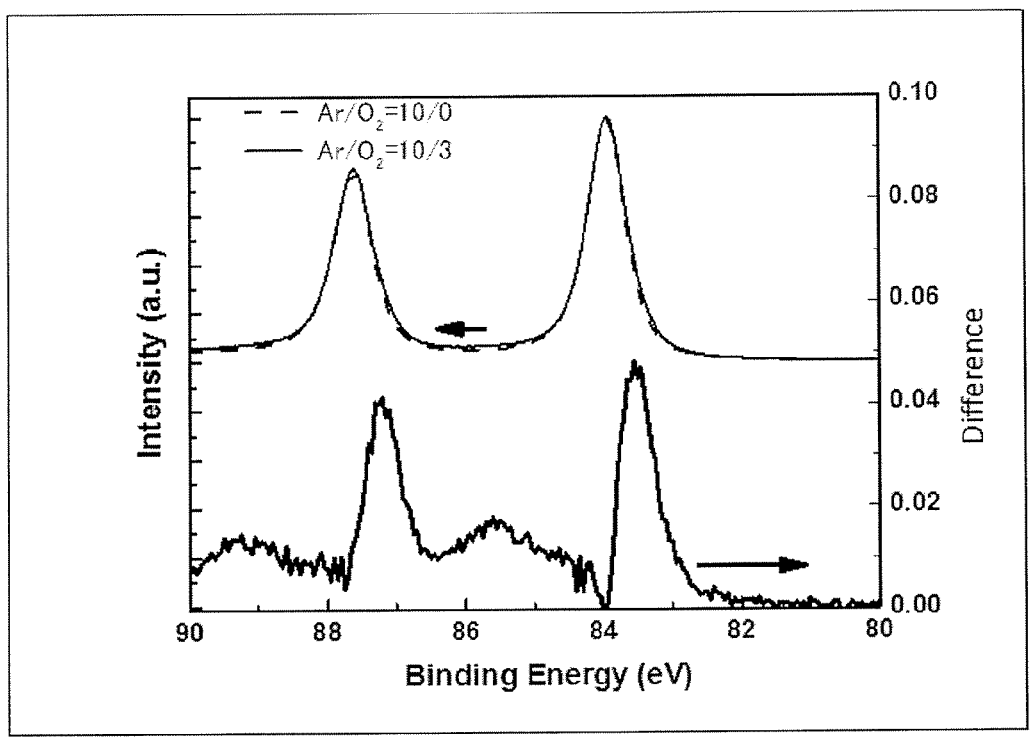
FIG. 24 is a graph contrastively showing results of the state analysis of a Au4f orbital for each of the components shown in FIG. 23.

On the other hand, attention is focused on the Au4f orbital with reference to FIG. 24, for the Au electrode which was formed with the oxygen introduction, the spectrum is slightly broad. It is clarified from differential spectrum that the intensities near peak positions (about 85 eV and about 89 eV) which appear when Au₂O₃ is formed become very slightly higher. Thus, the result which suggests a possibility of an occurrence of binding of oxygen and Au was obtained. However, the clear difference such as that between Pt and PtO$_x$ cannot be found.

The reason for this is assumed to be that Au is not susceptible to oxidation than Pt. As seen from FIG. 23, since the barrier height becomes high by the oxygen introduction similarly to the relationship between Pt and PtO$_x$ it is assumed that AuO$_x$ is formed only near the interface or absorption of oxygen occurs. As mentioned in Experimental Example 5, since the Schottky barrier height is significantly affected by the electron state (work function) near the joined interface, the barrier height is changed only by the very thin oxidation of the electrode at the interface or the oxygen containing state thereof, thus the barrier height obtained by the XPS can more sensitively detect the interface oxidation of the joined Au.

On the other hand, when the 4f orbital of Au is evaluated by the XPS, since it obtains average information of the Au electrode, it is difficult to defect the oxidation of Au when oxidation occurs slimly on the interface.

From the above description, also for Au similarly to Pt, it is assumed that the reason that the superior resistance variation characteristics could be obtained by forming the electrode with introducing oxygen is that Au near the interface was oxidized or became a state of containing oxygen. However, differently from Pt, it is assumed that only the interface is oxidized in the Au electrode formed with the oxygen introduction, therefore, the electrode has a structure of imitative multiple layers such as Au/AuO$_x$/Nb:SrTiO₃, thus, a variation of the oxygen flow ratio in the formation of the electrode is not needed as shown in Experimental Example 2.

It is recognized from the above result that a resistance switching device of which the resistance variation ratio, the response characteristics and the resistance memory characteristics are superior can be produced by the introduction of the oxygen during the formation of the Au electrode similarly to Pt.

EXPLANATION OF THE REFERENCE NUMERALS 1, 1a, 1b, 1c, 1d—resistance switching device
2—n-type oxide semiconductor
3—first electrode
4—second electrode
5—lower layer (oxygen-containing layer)
6—upper layer
7—n-type oxide semiconductor thin layer
8—n-type oxide semiconductor substrate
9—supporting substrate

The invention claimed is:

1. A resistance switching device comprising:
an n-type oxide semiconductor selected from the group consisting of titanium oxide (TiO2),(strontium titanate (SrTiO3), barium titanate (BaTiO3), and a solid solution thereof;
a first electrode disposed on a first surface of the n-type oxide semiconductor;
a second electrode disposed on a second surface of the n-type oxide semiconductor such that the n-type oxide semiconductor is interposed between the first and second electrodes; and
a Schottky junction formed at an interface between a portion of the first electrode and the n-type oxide semiconductor, the portion of the first electrode comprising a platinum containing oxygen layer which abuts the n-type semiconductor, the Schottky junction having resistance variation memory characteristics when a voltage with different polarities is applied between the first and second electrodes.

2. The resistance switching device' according to claim 1, wherein the first electrode further comprises an outer layer disposed on the platinum containing oxygen layer, the outer layer comprising at least one of gold and platinum.

3. The resistance switching device according to claim 2, wherein the platinum containing oxygen layer has a thickness between 1 nm and 50 nm.

4. The resistance switching device according to claim 1, wherein the first electrode only partially covers the first surface of the n-type oxide semiconductor.

5. The resistance switching device according to claim 1, wherein the n-type oxide semiconductor comprises an n-type oxide semiconductor thin layer and an n-type oxide semiconductor substrate.

6. The resistance switching device according to claim 5, wherein the n-type oxide semiconductor thin layer comprises $BaTiO_3$.

7. The resistance switching device according to claim 5, wherein the first surface of the n-type oxide semiconductor comprises n-type oxide semiconductor thin layer.

8. The resistance switching device according to claim 1, further comprising a supporting substrate disposed on a surface of the second electrode opposite the n-type oxide semiconductor.

9. A resistance switching device comprising:
an n-type oxide semiconductor selected from the group consisting of titanium oxide (TiO2), strontium titanate (SrTiO3), barium titanate (BaTiO3), and a solid solution thereof;
a first electrode disposed on a surface of the n-type oxide semiconductor;
a second electrode disposed on the surface of the n-type oxide semiconductor with a portion of the n-type oxide semiconductor interposed between the first and second electrodes; and
a Schottky junction formed at an interface between a portion of the first electrode and the n-type oxide semiconductor, the portion of the first electrode comprising a platinum containing oxygen layer which abuts the n-type semiconductor, the Schottky junction having resistance variation memory characteristics when a voltage with different polarities is applied between the first and second electrodes.

10. The resistance switching device according to claim 1, wherein ΔR calculated according to the following equation is not less than 100,000, $$\Delta R = I_{LRS}/I_{HRS}$$

wherein $I_{LRS}$ is a current value in a low resistance state and $I_{HRS}$ is a current value in a high resistance state, at the voltage at which the maximum resistance variation is provided when the voltage between the first electrode and the second electrode is swept within the range of −5 V to 5 V.

11. The resistance switching device of claim 1, wherein the platinum containing oxygen layer is formed of platinum oxide.

12. the resistance switching device of claim 1, wherein the portion of the first electrode which abuts the n-type oxide semiconductor is formed under an atmosphere in which the oxygen partial pressure is 0.01-0.22 Pa.

13. A resistance switching device comprising:
an n-type oxide semiconductor selected from the group consisting of titanium oxide (TiO2), strontium titanate (SrTiO3), barium titanate (BaTiO3), and a solid solution thereof;
a first electrode disposed on a first surface of the n-type oxide semiconductor;
a second electrode disposed on a second surface of the n-type oxide semiconductor such that the n-type oxide semiconductor is interposed between the first and second electrodes; and
a Schottky junction formed at an interface between a portion of the first electrode and the n-type oxide semiconductor, the portion of the first electrode comprising a gold containing oxygen layer which abuts the n-type semiconductor, the Schottky junction having resistance variation memory characteristics when a voltage with different polarities is applied between the first and second electrodes.

14. The resistance switching device according to claim 13, wherein the first electrode further comprises an outer layer disposed on the gold containing oxygen layer, the outer layer comprising at least one of gold and platinum.

15. The resistance switching device according to claim 14, wherein the gold containing oxygen layer has -a thickness between 1 nm and 50 nm.

16. The resistance switching device according to claim 13, wherein the first electrode only partially covers the first surface of the n-type oxide semiconductor.

17. The resistance switching device according to claim 13, wherein the n-type oxide semiconductor comprises an n-type oxide semiconductor thin layer and an n-type oxide semiconductor substrate.

18. The resistance switching device according to claim 17, wherein the n-type oxide semiconductor thin layer comprises $BaTiO_3$.

19. The resistance switching device according to claim 17, wherein the first surface of the n-type oxide semiconductor comprises the n-type oxide semiconductor thin layer.

20. The resistance switching device according to claim 13, further comprising a supporting substrate disposed on a surface of the second electrode opposite the n-type oxide semiconductor.

21. The resistance switching device according to claim 13, wherein ΔR calculated according to the following equation is not less than 100,000, $$\Delta R = I_{LRS}/I_{HRS}$$

wherein $I_{LRS}$ is a current value in a low resistance state and $I_{HRS}$ is a current value in a high resistance state, at the voltage at which the maximum resistance variation is provided when the voltage between the first electrode and the second electrode is swept within the range of −5 V to 5 V.

22. The resistance switching device of claim 13, wherein the gold containing oxygen layer is formed of gold oxide.

23. The resistance switching device of claim 13, wherein the portion of the first electrode which abuts the n-type oxide semiconductor is formed under an atmosphere in which the oxygen partial pressure is 0.01-0.22 Pa.

24. A resistance switching device comprising:

an n-type oxide semiconductor selected from the group consisting of titanium oxide (TiO2), strontium titanate (SrTiO3), barium titanate (BaTiO3), and a solid solution thereof;

a first electrode disposed on a surface of the n-type oxide semiconductor;

a second electrode disposed on the surface of the n-type oxide semiconductor with a portion of the n-type oxide semiconductor interposed between the first and second electrodes; and a Schottky junction formed at an interface between a portion of the first electrode and the n-type oxide semiconductor, the portion of the first electrode comprising a gold containing oxygen layer which abuts the n-type semiconductor, the Schottky junction having resistance variation memory characteristics when a voltage with different polarities is applied between the first and second electrodes.

* * * * *